US006550035B1

(12) United States Patent
Okita

(10) Patent No.: US 6,550,035 B1
(45) Date of Patent: *Apr. 15, 2003

(54) METHOD AND APPARATUS OF REED-SOLOMON ENCODING-DECODING

(75) Inventor: Shigeru Okita, Tokyo (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/421,578

(22) Filed: Oct. 20, 1999

(30) Foreign Application Priority Data

Oct. 20, 1998 (JP) .......................................... 10-298895

(51) Int. Cl.$^7$ ............................................. H03M 13/00
(52) U.S. Cl. ...................................... 714/774; 714/784
(58) Field of Search ................................. 714/774, 784

(56) References Cited

U.S. PATENT DOCUMENTS

| | | | |
|---|---|---|---|
| 4,162,480 A | 7/1979 | Berlekamp | 714/784 |
| 4,845,713 A | 7/1989 | Zook | 714/784 |
| 4,868,828 A | 9/1989 | Shao et al. | 714/704 |
| 5,377,207 A | 12/1994 | Perlman | 714/784 |
| 5,689,452 A | 11/1997 | Cameron | 708/492 |
| 5,812,438 A * | 9/1998 | Lan et al. | 708/492 |
| 5,978,955 A | 11/1999 | Sharma | 714/782 |
| 5,978,956 A | 11/1999 | Weng et al. | 714/784 |
| 6,175,945 B1 | 1/2001 | Okita | 714/784 |
| 6,201,869 B1 | 3/2001 | Matsui et al. | 380/37 |
| 6,378,104 B1 * | 4/2002 | Okita | 714/784 |

OTHER PUBLICATIONS

Hasan, M.A.; An architecture for a universal Reed–Solomon encoder using a triangular basis multiplication algorithm; Canadian Conference on Electrical and Computer Engineering, 1993, pp.: 255–258 vol. 1.

Patent application Ser. No. 09/507,187, filed Feb. 18, 2000. *A Multi–Dimensional Galois Field Multiplier*, Texas Instruments Incorporated.

* cited by examiner

*Primary Examiner*—Albert Decady
*Assistant Examiner*—Joseph D. Torres
(74) *Attorney, Agent, or Firm*—Gerald E. Laws; W. James Brady, III; Frederick J. Telecky, Jr.

(57) ABSTRACT

A Reed-Solomon encoding device is provided that can handle multiple RS (Reed-Solomon) codes using different field generation polynomials. The encoding device uses a first Galois field transformation that transforms source data into a specified Galois field on the basis of a first Galois field transformation parameter. The transformed source data is received by an encoder that performs encoding processing using a selected multiplication coefficient set. A second Galois field transformation is used for performing an inverse transform of the encoded data on the basis of a second Galois field transformation parameter. A parameter output is used for outputting the first Galois field transformation parameter, the second Galois field transformation parameter, and the selected multiplication coefficient set. The parameter output generator is operable to be loaded with transformation parameters and multiplication coefficients selected from a plurality of transformation parameters and multiplication coefficients.

21 Claims, 12 Drawing Sheets

FIG. 2

| $\beta^z$ | COLUMN VECTOR | $\alpha^{pz}$ | COLUMN VECTOR |
|---|---|---|---|
| 0 | $(0\ 0\ 0\ 0\ 0\ 0\ 0\ 0)^T$ | 0 | $(0\ 0\ 0\ 0\ 0\ 0\ 0\ 0)^T$ |
| $\beta^0$ | $(0\ 0\ 0\ 0\ 0\ 0\ 0\ 1)^T$ | $\alpha p \times 0 = \alpha^0$ | $(0\ 0\ 0\ 0\ 0\ 0\ 0\ 1)^T$ |
| $\beta^1$ | $(0\ 0\ 0\ 0\ 0\ 0\ 1\ 0)^T$ | $\alpha p \times 1 = \alpha^{241}$ | $(0\ 1\ 0\ 1\ 1\ 0\ 0\ 0)^T$ |
| $\beta^2$ | $(0\ 0\ 0\ 0\ 0\ 1\ 0\ 0)^T$ | $\alpha p \times 2 = \alpha^{227}$ | $(1\ 0\ 0\ 1\ 0\ 0\ 0\ 0)^T$ |
| $\beta^3$ | $(0\ 0\ 0\ 0\ 1\ 0\ 0\ 0)^T$ | $\alpha p \times 3 = \alpha^{213}$ | $(1\ 1\ 1\ 1\ 0\ 0\ 1\ 0)^T$ |
| $\beta^4$ | $(0\ 0\ 0\ 1\ 0\ 0\ 0\ 0)^T$ | $\alpha p \times 4 = \alpha^{199}$ | $(0\ 0\ 0\ 0\ 1\ 1\ 1\ 0)^T$ |
| $\beta^5$ | $(0\ 0\ 1\ 0\ 0\ 0\ 0\ 0)^T$ | $\alpha p \times 5 = \alpha^{185}$ | $(0\ 0\ 1\ 1\ 0\ 1\ 1\ 1)^T$ |
| $\beta^6$ | $(0\ 1\ 0\ 0\ 0\ 0\ 0\ 0)^T$ | $\alpha p \times 6 = \alpha^{171}$ | $(1\ 0\ 1\ 1\ 0\ 0\ 1\ 1)^T$ |
| $\beta^7$ | $(1\ 0\ 0\ 0\ 0\ 0\ 0\ 0)^T$ | $\alpha p \times 7 = \alpha^{157}$ | $(1\ 1\ 0\ 1\ 0\ 1\ 0\ 1)^T$ |
| $\beta^8$ | $(0\ 0\ 1\ 0\ 1\ 1\ 0\ 1)^T$ | $\alpha p \times 8 = \alpha^{143}$ | $(0\ 1\ 0\ 1\ 0\ 1\ 0\ 0)^T$ |
| $\beta^9$ | $(0\ 1\ 0\ 1\ 1\ 0\ 1\ 0)^T$ | $\alpha p \times 9 = \alpha^{129}$ | $(0\ 0\ 0\ 1\ 0\ 1\ 1\ 1)^T$ |
| ... | ... | ... | ... |
| $\beta^{91}$ | $(0\ 0\ 1\ 1\ 1\ 1\ 1\ 1)^T$ | $\alpha p \times 91 = \alpha^1$ | $(0\ 0\ 0\ 0\ 0\ 0\ 1\ 0)^T$ |
| ... | ... | ... | ... |
| $\beta^{254}$ | $(1\ 0\ 0\ 1\ 0\ 1\ 1\ 0)^T$ | $\alpha p \times 254 = \alpha^{14}$ | $(0\ 0\ 0\ 1\ 0\ 0\ 1\ 1)^T$ |

⊗ $GF_a$ : MULTIPLIER OF $GF_a(2^m)$

⊕ : ADDER OF $GF_a(2^m)$

⊗ $GF_a$ : MULTIPLIER OF $GF_a(2^m)$

⊕ : ADDER OF $GF_a(2^m)$

METHOD AND APPARATUS OF REED-SOLOMON ENCODING-DECODING

FIELD OF THE INVENTION

The present invention pertains to a Reed-Solomon encoding device and method and a Reed-Solomon decoding device and method for use as error correction codes of recording media and digital transmission.

BACKGROUND OF THE INVENTION

Reed-Solomon codes (hereinafter referred to as RS codes) have high encoding efficiency and are very effective in eliminating burst errors. Consequently, they are mainly used as outside codes of recording media and digital transmission. Also, with advancements in IC technology, it has become possible to fabricate encoding/decoding ICs as single chips corresponding to codes with a relatively high correction power for 8-byte or higher correction. As a result, its application range has expanded rapidly.

RS codes are characterized by a very high degree of design flexibility pertaining to the forming method of encoding. For example, even for a Galois field $GF(2^m)$ that is frequently used in RS codes, usually, as a condition of its field formation polynomial, the period should be $2m-1$. Consequently, there exist various types. In addition, there is a wide range for selecting the roots of the code forming polynomial that realizes the same correction power. That is, if the root of the field formation polynomial is $\alpha$, then as a condition for realizing a correction of t bytes, the root of the code forming polynomial can be selected from a group of at least 2t consecutive powers of $\alpha$, that is, $(\alpha^b, \alpha^{b+1}, \alpha^{b+2}, \ldots \alpha^{b+2t-1})$. Here, b may be any integer. Consequently, there exists a significant number of different RS codes for the same t-byte correction.

From the standpoint of system development, such design flexibility is desirable. However, from the standpoint of standardization, this is undesirable. The requirement for correction power, etc., usually dictates the need for a Galois field $GF(2^8)$ with $2^8$ elements. However, there are various other parameters. The code length and correction power, of course, depend on the specific requirements. Among the trivial differences, the greatest influence is the difference in the field formation polynomial. For example, if RS encoding/decoding devices are formed to correspond to two systems and the field formation polynomials are different, then the multipliers of their Galois fields will also be different. Consequently, compatibility is impossible. In particular, when efforts are made to correspond to that which has a higher correction power, the proportion of the multiplier of the aforementioned Galois field in the circuit scale becomes larger. In the prior art, one must prepare multipliers of Galois fields corresponding to the two systems. This leads to an increase in the cost of the device.

In practice, even in the same digital transmission field, the field formation polynomial used in satellite communications and those used in satellite broadcasting are different. This is mainly because standardization is difficult due to differences in jurisdiction between the communication field and the broadcasting field. Also, when the aforementioned standards were set up, there was little need for a common field formation polynomial.

In recent years, however, during discussions regarding the unification of communication and broadcasting, the aforementioned need became clearer. However, it is very hard to make changes to realize complete standardization. Also, for the RS codes adopted for recording media, manufacturers usually lead the development, and in few cases is the same field formation polynomial adopted for recording media developed by different manufacturers.

FIG. 11 is a schematic diagram illustrating a conventional RS encoding/decoding device handling two or more RS codes, that is, for handling $RS_a$ code, $RS_b$ code, . . . $RS_x$ code. It has multipliers (10a)–(10x) of Galois fields $GF_a(2^m)$, $GF_b(2^m)$, . . . $GF_x(2^m)$ corresponding to field formation polynomials, respectively, and multiplication coefficient memory units (11a)–(11x) that store a collection of multiplication coefficients of Galois fields $\{\alpha_{a[i]}\}$, $\{\beta_{b[i]}\}$, . . . $\{\chi_{x[k]}\}$, corresponding to the code forming polynomials, respectively. The conventional RS encoding/decoding device also has inverse element arithmetic circuits $12a$–$12x$ corresponding to the codes for division.

In the following, in order to simplify the explanation, conventional RS encoding/decoding device 1 that handles two RS codes, that is, $RS_a$ code and $RS_b$ code will be used. Here, for both $RS_a$ code and $RS_b$ code, the correction power corresponds to a correction of t bytes.

FIG. 12 is a diagram illustrating surplus arithmetic circuit 202 that forms conventional RS encoding/decoding device 1. In surplus arithmetic circuit 202, collection of multiplication coefficients of Galois fields $\{\alpha_{ao[i]}\}$, $i=0$–L is contained in said collection of multiplication coefficients of Galois fields $\{\alpha_{a[i]}\}$, and collection of multiplication coefficients of Galois fields $\{\beta_{be[j]}\}$, $j=0$–L is contained in said collection of multiplication coefficients of Galois fields $\{\beta_{b[j]}\}$. Here, L is $2t-1$ or $2t$ (same in the following).

As shown in FIG. 12, surplus arithmetic circuit 202 of the polynomial has multipliers 203-0~203-L, multipliers 208-0~208-L, switches 204-0~204-L, registers 205-0~205-L, adders 206-1~206-L, and adder 207.

Switches 204-0~204-L select multipliers 203-0~203-L in the case of $RS_a$ encoding and multipliers 208-0~208-L in the case of $RS_b$ encoding.

Usually, RS decoding device is composed of syndrome arithmetic circuit, error location polynomial and evaluation polynomial arithmetic circuit, error location detecting circuit, evaluation value detecting circuit, and correction execution circuit. Of those, for said error location polynomial arithmetic circuit and evaluation polynomial arithmetic circuit, the known methods include the Euclidean algorithm method and the Barlekamp-Massey method.

FIG. 13 is a diagram illustrating a conventional constitutional example of syndrome arithmetic circuit 209 corresponding to said two RS codes. Here, the collection of multiplication coefficients of Galois fields $\{\alpha_{as[i]}\}$, $i=0$–L is contained in said $\{\alpha_{a[i]}\}$, and the collection of multiplication coefficients of Galois fields $\{\beta_{bs[j]}\}$, $j=0$–L is contained in said $\{\beta_{b[j]}\}$.

As shown in FIG. 13, syndrome arithmetic circuit 209 has multipliers 213-0~213-L, switches 214-0~214-L, registers 215-0~215-L, adders 216-0~216-L, and multipliers 217-0~217-L.

Switches 214-0~214-L select multipliers 213-0~213-L in the case of $RS_a$ encoding and multipliers 217-0~217-L in the case of $RS_b$ encoding.

FIG. 14 is a diagram illustrating an example of the conventional constitution of polynomial division circuit 221, one of the major elements of the error location polynomial and evaluation polynomial arithmetic circuit, corresponding to said two RS codes.

As shown in FIG. 14, polynomial division circuit 221 has switches 222-0~222-L, multipliers 223-0~223-L, multipliers 228-0~228-L, registers 225-0~225-L, registers 224-0~224-L, adders 226-0~226-L, registers 227, 229, inverse element arithmetic circuits 231, 232, multipliers 230, 231, and switch 234.

Switches 222-0~222-L select multipliers 223-0~223-L in the case of $RS_a$ encoding and multipliers 228-0~228-L in the case of $RS_b$ encoding. Also, switch 234 selects multiplier 230 in the case of $RS_a$ encoding and multiplier 231 in the case of $RS_b$ encoding.

FIG. 15 is a diagram illustrating an example of the conventional constitution of polynomial multiplier 241, a major element of error location polynomial and evaluation polynomial arithmetic circuit, corresponding to said two RS codes.

As shown in FIG. 15, polynomial multiplier 241 has multipliers 243-0~243-L, multipliers 248-0~248-L, switches 242-0~242-L, registers 245-0~245-L, adders 246-1~246-L, and registers 247-0~247-L.

Switches 242-0~242-L select multipliers 243-0~243-L in the case of $RS_a$ encoding and multipliers 248-0~248-L in the case of $RS_b$ encoding.

FIG. 16 is a diagram illustrating an example of the conventional constitution of error location detecting circuit 251 corresponding to said two RS codes.

As shown in FIG. 16, error location detecting circuit 251 has multipliers 252-0~252-n, multipliers 258-0~258-n, switches 252-0~252-n, registers 255-0~255-n, adders 256-1~256-n0, and detecting circuit 257.

Switches 252-0~252-n select multipliers 252-0~252-n in the case of $RS_a$ encoding and multipliers 258-0~258-n in the case of $RS_b$ encoding.

Here, the collection of multiplication coefficients of Galois fields $\{\alpha_{ac[i]}\}$, i=0~n=t is contained in said $\{\alpha_{a[i]}\}$, and the collection of multiplication coefficients of Galois fields $\{\beta_{bc[j]}\}$, j=0~n=t is contained in said $\{\beta_{b[j]}\}$. When erasure-and-error correction is carried out, one has I=0~n=2t, j=0~n=2t.

FIG. 17 is a diagram illustrating an example of the conventional constitution of evaluation value detecting circuit 261 corresponding to said two RS codes.

As shown in FIG. 17, evaluation value detecting circuit 261 has multipliers 262-0~262-(n−1), multipliers 267-0~267-(n−1), switches 262-0~262-(n−1), registers 265-0~265-(n−1), and adders 266-1~266-(n−1).

Switches 262-0~262-(n−1) select multipliers 262-0~262-(n−1) in the case of $RS_a$ encoding and multipliers 267-0~267-(n−1) in the case of $RS_b$ encoding.

Here, the collection of multiplication coefficients of Galois fields $\{\alpha_{av[i]}\}$, i=0~n−1 is contained in said $\{\alpha_{a[i]}\}$, and the collection of multiplication coefficients of Galois fields $\{\beta_{bv[j]}\}$, j=0~n−1 is contained in said $\{\beta_{b[j]}\}$.

In this way, in the conventional constitution of RS encoding/decoding device for handling two or more RS codes, it is necessary to have multipliers and inverse element arithmetic circuits corresponding to the respective field formation polynomials, and to be able to switch between them.

Also, in the aforementioned constitution, when changes takes place in the Galois field of the encoding target data and decoding target data, it is necessary to change the hardware constitution. As a result, it is impossible to handle diverse types of Galois field data encoding/decoding in a flexible way, which is undesirable.

The purpose of the present invention is to solve the aforementioned problems of the conventional methods by providing a Reed-Solomon encoding device and method that can reduce the scale of the device and can decrease the cost of the device.

Another purpose of the present invention is to provide a Reed-Solomon encoding device and method that can perform diversified Galois field data encoding in a flexible way.

Yet another purpose of the present invention is to provide a Reed-Solomon decoding method and device that can reduce the scale and cost of the device.

Yet another purpose of the present invention is to provide a Reed-Solomon decoding device and method that can perform diversified Galois field data decoding in a flexible way.

SUMMARY OF INVENTION

In order to solve the aforementioned problems and to realize the aforementioned purposes, the present invention provides a type of Reed-Solomon encoding device characterized by the fact that the Reed-Solomon encoding device that handles multiple RS (Reed-Solomon) codes by means of different field formation polynomials has the following means: a first Galois field transformation means that transforms the input encoding target data into data of a prescribed Galois field on the basis of the input first Galois field transformation parameter, an encoding means that performs encoding processing by means of said transformed Galois field for said transformed encoding target data, a second Galois field transformation means that inverse transforms said encoded data into data of said Galois field before transformation on the basis of input second Galois field transformation parameter, and a parameter output means that outputs said first Galois field transformation parameter and said second Galois field transformation parameter.

In the Reed-Solomon encoding device of the present invention, a first Galois field transformation means and a second Galois field transformation means are used. For any of multiple RS codes, encoding processing is performed using a prescribed Galois field in the encoding means. As a result, there is no need to use multiplier and inverse element arithmetic units to correspond to each of multiple RS codes separately in the encoding means, so that the circuit scale can be reduced significantly.

Also, because said first Galois field transformation means and second Galois field transformation means perform Galois field transformation on the basis of the first Galois field transformation parameter and second Galois field transformation parameter output from the parameter output means, respectively, it is possible to make diversified and flexible changes for the contents of the Galois field transformation.

For the Reed-Solomon encoding device of the present invention, it is preferred that said encoding means have a multiplier corresponding to said transformed Galois field.

Also, the Reed-Solomon encoding device of the present invention preferably has the following features: said multiple RS codes are $RS_a$ codes and $RS_b$ codes using different field formation polynomials; the encoding symbols are Galois fields $GF_a(2^m)$ and $GF_b(2^m)$ extended on the basis of different mth field formation polynomials $Gp_a(x)$ and $Gp_b(x)$ on Galois field GF(2), respectively; for $\alpha$, which is a root of said $Gp_a(x)$ and a primitive element of said $GF_a(2^m)$, and $\beta$, which is a root of said $Gp_b(x)$ and a primitive element of said $GF_b(2^m)$, following Equation (25) is established; said $RS_b$ code is a t-symbol correction code, and its code forming polynomial $G_{cb}(x)$ is represented by following Equation (26); when said input encoding target data is encoded by means of said $RS_b$ code, said first Galois field transformation means transforms said input encoding target data from said Galois field $GF_b(2^m)$ into data of said Galois field $GF_a(2^m)$; said encoding means performs encoding corresponding to following Equation (27), which is the polynomial transforming said code forming polynomial $G_{cb}(x)$ into said Galois field $GF_a(2^m)$; and said second Galois field transformation means inverse-transforms said encoded data from said Galois field $GF_a(2^m)$ into data of said Galois field $GF_b(2^m)$.

$$Gp_b(\alpha^p) = 0 \qquad \text{Equation 25}$$

$$Gc_b(x) = \prod_{j=0}^{L}(x+\beta^{q(b+j)}), \quad L = 2t-1, \text{ or } 2t \qquad \text{Equation 26}$$

$$Gc_{ba}(x) = \prod_{j=0}^{L}(x+\alpha^{pq(b+j)}), \quad L = 2t-1, \text{ or } 2t. \qquad \text{Equation 27}$$

Also, the Reed-Solomon encoding device of the present invention is preferably characterized by the following features: for said first Galois field transformation means, when m of the $2^m$ input/output relationships are represented by a transposed matrix $(\ldots)^T$, with respect to m-bit input $(00\ldots0001)^T$, m-bit output $A_1=(00\ldots001)^T$ is performed; with respect to m-bit input $(00\ldots0010)^T$, m-bit output $A_1=(A_{1,m-1}, A_{1,m-2}, \ldots A_{1,0})^T$ is performed; with respect to m-bit input $(00\ldots0100)^T$, m-bit output $A_2=(A_{2,m-1}, A_{2,m-2}, \ldots A_{2,0})^T$ is performed; with respect to m-bit input $(01\ldots0000)^T$, m-bit output $A_{m-2}=(A_{m-2,m-1}, A_{m-2,m-2}, \ldots A_{m-2,0})^T$ is performed; with respect to m-bit input $(10\ldots0000)^T$, m-bit output $A_{m-1}=(A_{m-1,m-1}, A_{m-1,m-2}, \ldots A_{m-1,0})^T$ is performed; when m×m matrix $[H_{ba}]$ is defined by following Equation (28), with respect to said m-bit input data $D_{b-in}$, arithmetic operation is performed according to following Equation (29) to form m-bit output data $D_{a-out}$.

$$[H_{ba}] = (A_{m-1}A_{m-2} \ldots A_2A_1A_0) \qquad \text{Equation 28}$$

$$D_{a-out} = [H_{ba}] \times D_{b-in}. \qquad \text{Equation 29}$$

Also, for the Reed-Solomon encoding device, it is preferred that said parameter output means outputs said matrix $[H_{ba}]$ as said first Galois field transformation parameter to said first Galois field transformation means.

Also, the Reed-Solomon encoding device of the present invention preferably has the following features: said parameter output means outputs rows of said matrix $[H_{ba}]$ as said first Galois field transformation parameter to the first Galois field transformation means in the order of rows; said first Galois field transformation means has the following means: multiple AND operation means corresponding in number to said bit data and performing the following operation: inputting from the first input terminal the bit data corresponding to the rows of said matrix $[H_{ba}]$ input as said first Galois field transformation parameter, inputting from the second input terminal the corresponding bit data of said input encoding target data, and performing a logical AND operation on said bit data input from the first input terminal and said bit data input from the second input terminal; and an exclusive-OR operation means that operates to get exclusive-OR of the operation results of said multiple AND operation means.

Also, for the Reed-Solomon encoding device of the present invention, it is preferred that when the inverse matrix of said matrix $[H_{ba}]$ is taken as $[H_{ab}]$, said second Galois field transformation means perform arithmetic operation according to following Equation (30) to form m-bit output data $D_{b-out}$.

$$D_{b-out} = [H_{ab}] \times D_{a-in} \qquad \text{Equation 30}$$

Also, for the Reed-Solomon encoding device of the present invention, it is preferred that said parameter output means output said matrix $[H_{ab}]$ as said second Galois field transformation parameter to said second Galois field transformation means.

Also, the Reed-Solomon encoding device preferably has the following features: said parameter output means outputs rows of said matrix $[H_{ab}]$ as said second Galois field transformation parameter to the second Galois field transformation means in the order of rows; said second Galois field transformation means has the following means: multiple AND operation means corresponding in number to said bit data and performing the following operation: input from the first inputting terminal the bit data corresponding to rows of said matrix $[H_{ab}]$ input as said second Galois field transformation parameter, inputting from the second input terminal the corresponding bit data of said encoded data, and performing a logical AND operation on said bit data input from the first input terminal and said bit data input from the second input terminal; and an exclusive-OR operation means that performs an exclusive-OR operation on the results of said multiple AND operations.

Also, it is preferred that the Reed-Solomon encoding device of the present invention also includes a multiplication coefficient memory means, and that said parameter output means sends the multiplication coefficients stored in said multiplication coefficient memory means to said multiplier.

Also, the present invention provides a type of Reed-Solomon decoding device characterized by the fact that the Reed-Solomon decoding device that corresponds to multiple RS codes by means of different field formation polynomials comprises the following means: a first Galois field transformation means that transforms the input decoding target data into prescribed Galois field data on the basis of the first input Galois field transformation parameters, a decoding means that performs the decoding process by means of said transformed Galois field for said transformed decoding target data, a second Galois field transformation means that inverse-transforms said decoded data into said Galois field data before transformation on the basis of the second input Galois field transformation parameters, and a parameter output means that outputs said first Galois field transformation parameter and said second Galois field transformation parameter.

In the Reed-Solomon decoding device of the present invention, a first Galois field transformation means and a second Galois field transformation means are arranged. For any of multiple RS codes, decoding processing is performed using a prescribed Galois field in the decoding means. As a result, there is no need to use multiplier and inverse element arithmetic unit to correspond to each of the multiple RS codes separately in the decoding means, so that the circuit scale can be reduced significantly.

Also, because said first Galois field transformation means and second Galois field transformation means perform Galois field transformation on the basis of the first Galois field transformation parameters and second Galois field transformation parameters output from the parameter output means, respectively, it is possible to make diverse and flexible changes for the contents of the Galois field transformation.

For the Reed-Solomon decoding device of the present invention, it is preferred that said decoding means have a multiplier corresponding to said transformed Galois field.

Also, the Reed-Solomon decoding device of the present invention preferably has the following features: said multiple RS codes are $RS_a$ codes and $RS_b$ codes using different field formation polynomials; the encoding symbols are Galois fields $GF_a(2^m)$ and $GF_b(2^m)$ extended on the basis of the different mth field formation polynomials $Gp_a(x)$ and $GP_b(x)$ on Galois field GF(2), respectively; with respect to α, which is a root of said $Gp_a(x)$ and a primitive element of said $GF_a(2^m)$, and β, which is a root of said $Gp_b(x)$ and a primitive element of said $GF_b(2^m)$, the following Equation (31) is established; said $RS_b$ code is a t-symbol correction code, and its code forming polynomial $G_{cb}(x)$ is represented by following Equation (32); when said input decoding target data is decoded, said first Galois field transformation means transforms said decoding target data from said Galois field $GF_b(2^m)$ into data of said Galois field $GF_a(2^m)$; said decoding means performs decoding corresponding to the following Equation (33) that is the polynomial transforming said code forming polynomial $G_{cb}(x)$ into said Galois field $GF_a(2m)$; and said second Galois field transformation means transforms said decoded data from said Galois field $GF_a(2^m)$ into data of said Galois field $GF_b(2^m)$.

$$Gp_b(\alpha^p) = 0 \qquad \text{Equation 31}$$

$$Gc_b(x) = \prod_{j=0}^{L}(x + \beta^{q(b+j)}), \quad L = 2t-1, \text{ or } 2t \qquad \text{Equation 32}$$

$$Gc_{ba}(x) = \prod_{j=0}^{L}(x + \alpha^{pq(b+j)}), \quad L = 2t-1, \text{ or } 2t \qquad \text{Equation 33}$$

Also, the Reed-Solomon decoding device of the present invention preferably has the following features: for said first Galois field transformation means, when m of the $2^m$ input/output relationships are represented by a transposed matrix $( \ldots )^T$, with respect to m-bit input $(00 \ldots 0001)^T$, m-bit output $A_1=(00 \ldots 001)^T$ is performed; with respect to m-bit input $(00 \ldots 0010)^T$, m-bit output $A_1=(A_{1,m-1}, A_{1,m-2}, \ldots A_{1,0})^T$ is performed; with respect to m-bit input $(00 \ldots 0100)^T$, m-bit output $A_2=(A_{2,m-1}, A_{2,m-2}, \ldots A_{2,0})^T$ is performed; with respect to m-bit input $(01 \ldots 0000)^T$, m-bit output $A_{m-2}=(A_{m-2,m-1}, A_{m-2,m-2}, \ldots A_{m2,0})^T$ is performed; with respect to m-bit input $(10 \ldots 0000)^T$, m-bit output $A_{m-1}=(A_{m-1,m-1}, A_{m-1,m-2}, \ldots A_{m-1,0})^T$ is performed; when m×m matrix $[H_{ba}]$ is defined by following Equation (34), with respect to said m-bit input data $D_{b-in}$, arithmetic operation is performed according to following Equation (35) to form m-bit output data $D_{a-out}$.

$$[H_{ba}] = (A_{m-1}A_{m-2} \ldots A_2A_1A_0) \qquad \text{Equation 34}$$

$$D_{a-out} = [H_{ba}] \times D_{b-in} \qquad \text{Equation 35}$$

Also, for the Reed-Solomon decoding device of the present invention, it is preferred that said parameter output means outputs said matrix $[H_{ba}]$ as said first Galois field transformation parameters to said first Galois field transformation means.

Also, the Reed-Solomon decoding device of the present invention preferably has the following features: said parameter output means outputs rows of said matrix $[H_{ba}]$ as said first Galois field transformation parameter to the first Galois field transformation means in the row order; said first Galois field transformation means comprises the following means: multiple AND operation means corresponding in number to said bit data and performing the following operation: inputting from the first input terminal the bit data corresponding to the rows of said matrix $[H_{ba}]$ input as said first Galois field transformation parameter, inputting from the second input terminal the corresponding bit data of said input decoding target data, and performing a logical AND operation on said bit data input from the first input terminal and said bit data input from the second input terminal; and an exclusive-OR operation means that performs an exclusive-OR operation on the results of said multiple AND operations.

Also, for the Reed-Solomon decoding device of the present invention, it is preferred that when the inverse matrix of said matrix $[H_{ba}]$ is taken as $[H_{ab}]$, said second Galois field transformation means perform arithmetic operation according to following Equation (36) to form m-bit output data $D_{b-out}$.

$$D_{b-out} = [H_{ab}] \times D_{a-in} \qquad \text{Equation 6}$$

Also, for the Reed-Solomon decoding device of the present invention, it is preferred that said parameter output means output said matrix $[H_{ab}]$ as said second Galois field transformation parameter to said second Galois field transformation means.

Also, the Reed-Solomon decoding device of the present invention preferably has the following features: said parameter output means outputs rows of said matrix $[H_{ab}]$ as said second Galois field transformation parameter to the second Galois field transformation means in the order of rows; said second Galois field transformation means has the following means: multiple AND operation means corresponding in number to said bit data and performing the following operation: inputting from the first input terminal the bit data corresponding to the rows of said matrix $[H_{ab}]$ input as said second Galois field transformation parameter, inputting from the second input terminal the corresponding bit data of said encoded data, and performing a logical AND operation on said bit data input from the first input terminal and said bit data input from the second input terminal; and an exclusive-OR operation means that performs an exclusive-OR operation on the results of said multiple AND operations.

Also, it is preferred that the Reed-Solomon decoding device of the present invention also comprises a multiplication coefficient memory means, and that said parameter output means send the multiplication coefficients stored in said multiplication coefficient memory means to said multiplier.

BRIEF DESCRIPTION OF THE DRAWINGS

FIG. 2 is a diagram illustrating the transformation table in the input-side transformation circuit and output-side transformation circuit shown in FIG. 1.

REFERENCE NUMERALS AND SYMBOLS AS SHOWN IN THE DRAWINGS

In the figures, 101 represents a RS encoding/decoding device, 102 a surplus arithmetic circuit, 109 a syndrome arithmetic circuit, 111 a multiplication coefficient memory unit, 112 a RS encoding/decoding core unit, 113-0~113-L a multiplier, 115 an inverse element arithmetic circuit, 119 an output-side transformation circuit, 120 a parameter setting unit, 121 a division circuit of polynomial, 141 a multiplication circuit of polynomial, 151 an error location detecting circuit, and 161 an evaluation value detecting circuit.

DESCRIPTION OF THE EMBODIMENT

Figure 1:
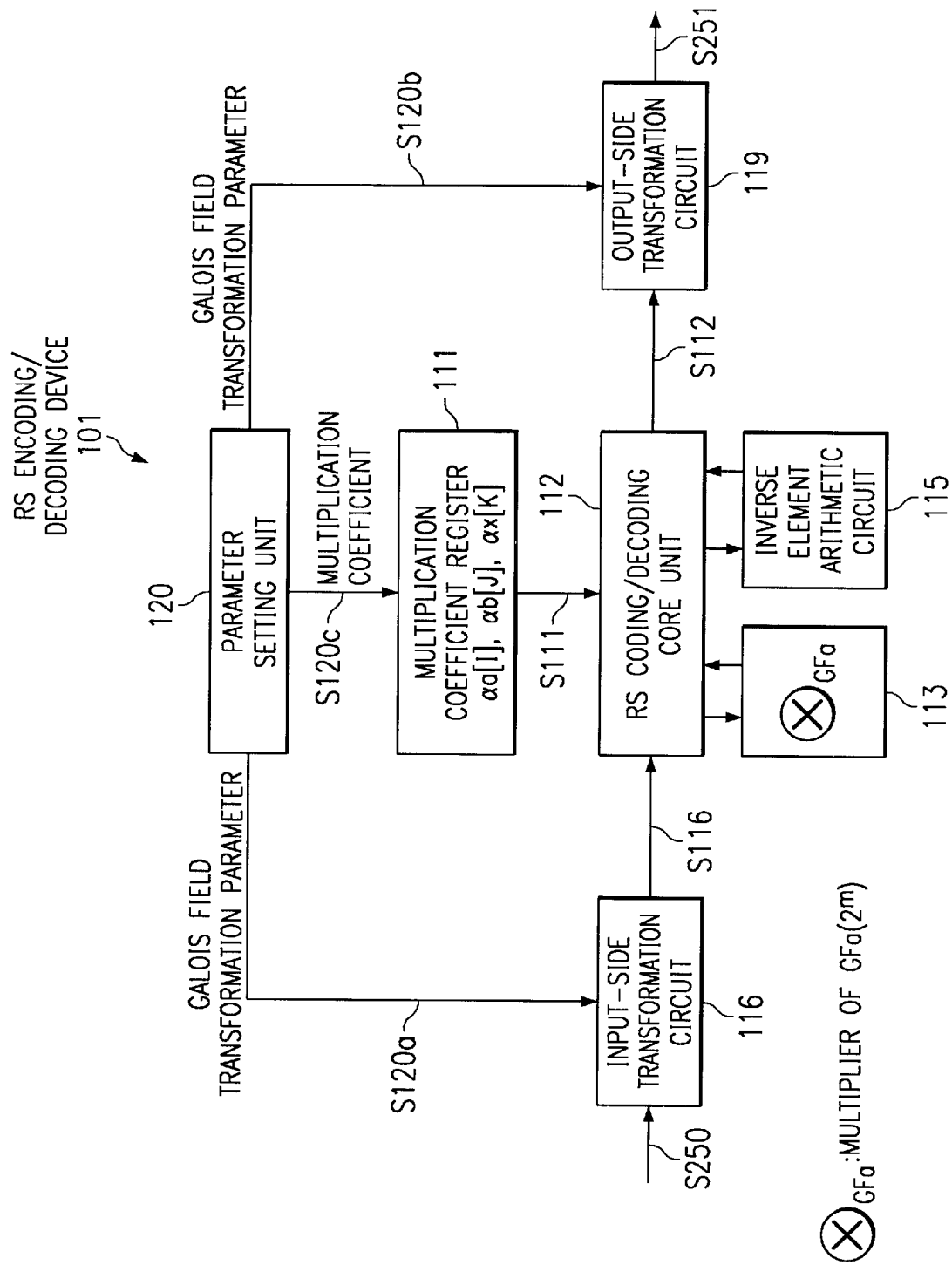
FIG. 1 is a schematic diagram illustrating the Reed-Solomon encoding/decoding device in an embodiment of the present invention.

FIG. 1 is a schematic diagram illustrating RS encoding/decoding device 101 of the present embodiment.

RS encoding/decoding device 101 can handle two or more RS codes, that is, $RS_a$ code, $RS_b$ code, ... $RS_x$ code.

As shown in FIG. 1, it has the following parts: multipliers 113 of Galois fields corresponding to field formation polynomials of $GF_a(2^m)$, multiplication coefficient memory units 111 that store collection of multiplication coefficients of Galois fields $\{\alpha_{a[i]}\}$, $\{\alpha_{b[j]}\}$, ... $\{\alpha_{x[k]}\}$, corresponding to code forming polynomials, respectively, RS encoding/decoding core unit 112 inverse element arithmetic circuit 115, input-side transformation circuit 116, output-side transformation circuit 119, and parameter setting unit 120.

As shown in FIG. 1, RS encoding/decoding device 101 has a constitution in which input-side transformation circuit 116 and output-side transformation circuit 119 are attached to the input side and output side of RS encoding/decoding core unit 112, respectively.

Input-side transformation circuit 116 and output-side transformation circuit 119 perform transformation of data on the basis of Galois field transformation parameters S120a and S120b input from parameter setting unit 120.

Also, RS encoding/decoding core unit 112 performs encoding and decoding on the basis of multiplication coefficient S120c input from parameter setting unit 120.

Switching is performed for Galois field transformation parameters S120a, S120b and multiplication coefficient S120c output from parameter setting unit 120 corresponding to the types of RS encoding and RS decoding, such as instructions from the user.

In the following, in order to simplify the explanation, RS encoding/decoding device 101 will be described that handles two RS codes, that is, $RS_a$ code and $RS_b$ code. Here, for both $RS_a$ code and $RS_b$ code, the correction power is for correcting t bytes.

In this embodiment, as an example of the case of RS encoding and decoding when q=88 and m=8 in said Equations (25)–(30) will be examined.

In this embodiment, because the topic pertains to the encoding/decoding method and device for said $RS_b$ code, for said $RS_a$ code, the only requirement is that the order of its field formation polynomial be identical to that of said $RS_b$ code. Also, in this embodiment, in order to simplify the explanation, it is assumed that the correction power for said $RS_a$ code is also for correction of t bytes, same as said $RS_b$ code.

$RS_a$ Code

For said $RS_a$ code, the field formation polynomial on GF(2) that forms basic field $GF_{a-B}(2^8)$ as defined by the encoding symbol of said code is defined by following Equation (37).

[Mathematical formula 37]

$$Gp_a(x) = x^8 + x^4 + x^3 + x^2 + 1 \qquad (37)$$

In addition, the code forming polynomial of said $RS_a$ is defined by following Equation (38).

[Mathematical formula 38]

$$Gc_a(x) = \prod_{i=0}^{L}(x+\alpha^{a+1}), \quad L = 2t-1, あるいは 21 \text{ or } 2t \qquad (38)$$

In this case, the coefficient of x is an element of said $GF_{a-B}(2^8)$, and extended field of encoding $GF_{a-E}(2^8)$ is equal to the basic field $GF_{a-B}(2^8)$. That is, in this embodiment, said Galois field $GF_a(2^8)$ as target of transformation corresponds to $GF_{a-B}(2^8)=GF_{a-E}(2^8)$.

Also, $\alpha$ is taken as a root of said $Gp_a(x)$ and the primitive element of said $GF_a(2^8)=GF_{a-B}(2^8)$. Here, in order to simplify the explanation, $\alpha$ is represented by means of a column vector $(00000010)^T$. Also, following Equation (39) is derived from said Equation (37).

[Mathematical formula 39]

$$\alpha^8 = \alpha^4 + \alpha^3 + \alpha^2 + 1 \qquad (39)$$

In column representation, one has $(\alpha^8)_a=(00011101)^T$. Here, $(X)_a$ shows the column vector representation of element X of said $GF_a(2^8)$. Also, one has $(\alpha^0)_a=(1)_a=(00000001)^T$.

$RS_b$ Code

For said $RS_b$ code, the field formation polynomial on GF(2) that forms the basic field as defined by the encoding symbol of said code is defined by following Equation (40).

[Mathematical formula 40]

$$Gp_b(x) = x^8 + x^5 + x^3 + x^2 + 1 \qquad (40)$$

In addition, the code forming polynomial of said $RS_b$ code is defined by following Equation (41).

[Mathematical formula 41]

$$Gc_b(x) = \prod_{j=0}^{L}(x+\beta^{8B(b+j)}), \quad L = 2t-1, あるいは 21 \text{ or } 2t \qquad (41)$$

Equation (41) corresponds to setting q=88 in said Equation (26). Strictly speaking, this RS code is contained in the Goppa code. Consequently, although the coefficient of x in said Equation (41) can be represented with an element of said $GF_{b-B}(2^8)$, it is still different from $GF_{b-B}(2^8)$, the basic field of the extended field $GF_{b-B}(2^8)$ of encoding. In this embodiment, said Galois field $GF_b(2^8)$ as target of transformation corresponds to $GF_{b-B}(2^8)$. Also, the Euclid decoding method for said Goppa code is described in "Sugiyama, Kasahara, Hirasawa: A method for solving key equation for decoding Goppa codes, Inf. and Cont., 27, 1975," and its erasure-and-error correction method is described in "Sugiyama, Kasahara, Hirasawa, Namekawa: An erasures-and-errors decoding algorithm for Goppa codes, IEEE Trans. Inform, Theory, 1976."

Also, $\beta$ is taken as a root of said $Gp_b(x)$ and the primitive element of said $GF_b(2^8)=GF_{b-B}(2^8)$. Here, $\beta$ is also represented by means of a column vector $(00000010)^T$. Also, following Equation (42) is derived from said Equation (40).

[Mathematical formula 42]

$$\beta^8 = \beta^6 + \beta^3 + \beta^2 + 1 \qquad (42)$$
$$\beta^9 = \beta \times \beta^8 = \beta^6 + \beta^4 + \beta^3 + \beta$$
$$\beta^{10} = \beta \times \beta^9 = \beta^7 + \beta^5 + \beta^4 + \beta^2$$
$$\beta^{11} = \beta \times \beta^{10} = \beta^8 + \beta^6 + \beta^5 + \beta^3$$
$$= \beta^5 + \beta^3 + \beta^2 + 1 + \beta^6 + \beta^5 + \beta^3$$
$$= \beta^6 + \beta^2 + 1$$

In column representation, one has $(\beta^8)_b=(00101101)^T$. Here, $(X)_b$ shows the column vector representation of element X of said $GF_b(2^8)$. Also, one has $(\beta^0)_b=(1)_b=(00000001)^T$.

For encoding of said $RS_b$ code, it is possible to perform transformation of the code forming polynomial while the Galois field is transformed. The transformation itself is relatively simple.

In the following, the various structural elements of RS encoding/decoding device 101 and the circuit that forms RS encoding/decoding core portion 112 will be examined.

Input-side Transformation Circuit and Output-side Transformation Circuit

For example, one can derive the relationship between $\alpha$ and $\beta$ as follows. $Gp_a(x)$ is a primitive polynomial on GF(2), and it has 8 roots, namely, $\alpha$, $\alpha^2$, $\alpha^4$, $\alpha^8$, $\alpha^{16}$, $\alpha^{32}$, $\alpha^{64}$, $\alpha^{128}$. Similarly, for primitive polynomial $Gp_{a-p}(x)$ with $\alpha^P$ as a root, there are a total of 8 roots, that is, in addition to $\alpha^P$, there are also the following roots: $\alpha^{2P}$, $\alpha^{4P}$, $\alpha^{8P}$, $\alpha^{16P}$, $\alpha^{32P}$, $\alpha^{64P}$, $\alpha^{128P}$. The following Equation (43) is established.

[Mathematical formula 43]

$$Gp_{a\_p}(x) = (x+\alpha^p)(x+\alpha^{4p})(x+\alpha^{8p}) \ldots (x+\alpha^{64p})(x+\alpha^{128p}) \qquad (43)$$

For said Equation (43), when p=241, following Equation (44) is established.

[Mathematical formula 44]

$$Gp_{a\_p}(x) = a^0 x^8 + a^0 x^6 + a^0 x^3 + a^0 x^2 + a^0 \qquad (44)$$

Here, because $\alpha^0=1$ on GF(2), the right-hand side of Equation (44) is in agreement with the right-hand side of said Equation (40). That is, said $Gp_{a-p}(x)$ and said $Gp_b(x)$ have the same roots on GF(2).

Also, when calculation is performed on said $GF_a(2^8)$, following Equation (45) is established.

[Mathematical formula 45]

$$Gp_b(\alpha^{241}) = 0 \qquad (45)$$

In this way, $\alpha^{241}$ of said Galois field $GF_a(2^8)$ corresponds to $\beta$ of said Galois field $GF_b(2^8)$. More specifically, from said Equation (45), following Equation (46) is established.

[Mathematical formula 46]

$$(\alpha^{241})^8 = (\alpha^{241})^5 + (\alpha^{241})^3 + (\alpha^{241})^2 + 1 \quad (46)$$
$$(\alpha^{241})^9 = \alpha^{241} \times (\alpha^{241})^8 = (\alpha^{241})^6 + (\alpha^{241})^4 + (\alpha^{241})^3 + \alpha^{241}$$
$$(\alpha^{241})^{10} = \alpha^{241} \times (\alpha^{241})^9 = (\alpha^{241})^7 + (\alpha^{241})^5 + (\alpha^{241})^4 + (\alpha^{241})^2$$
$$(\alpha^{241})^{11} = \alpha^{241} \times (\alpha^{241})^{10} = (\alpha^{241})^8 + (\alpha^{241})^2 + 1$$

On the basis of said Equation (46), if z represents any integer, it is possible to represent any element $\alpha^{241E}$ of said Galois field $GF_a(2^8)$ as a linear combination of $(\alpha^{241})^7$, $(\alpha^{241})^6, \ldots (\alpha^{241})^2, \alpha^{241}$ and 1.

That is, in the case of the following Equation (47), the relationship of following Equation (48) is established.

[Mathematical formula 47]

$$\beta^z = \sum_{i=0}^{7} B_{z,i} \beta^i \quad (47)$$

[Mathematical formula 48]

$$\alpha^{241z} = \sum_{i=0}^{7} B_{z,i} \alpha^{241i} \quad (48)$$

In said Equations (47) and (48), $B_{E,i} = 0$ or 1.

In this way, on said Galois field $GF_a(2^8)$, $\alpha^{241x}$ acts as if it is $\beta^x$ on Galois field $GF_b(2^8)$. On the other hand, $\beta^x$ on said Galois field $GF_b(2^8)$ corresponds to $\alpha^{241B}$ on said Galois field $GF_a(2^8)$.

As explained above, with input-side transformation circuit 116, which transforms from said Galois field $GF_b(2^8)$= $GF_{b\text{-}B}(2^8)$ to said Galois field $GF_a(2^8) = GF_{a\text{-}H}(2^8)$, any element $\beta^x$ of $GF_b(2^8)$ is transformed into element $\alpha^{241x}$ of $GF_a(2^8)$, and 0 is transformed to 0. For the transformed series, because the calculation rule for said $GF_a(2^8)$ is observed, as the multiplier in the Reed-Solomon encoding/composite treatment to be explained below, it is possible to make use of that which is defined for said $GF_a(2^8)$. This transformation operation is specifically carried out pertaining to the respective vector representation. In input-side transformation circuit 116, the transformation represented by the transformation table shown in FIG. 2 is carried out on the basis of Galois field transformation parameter S120a. Also, in output-side transformation circuit 119, transformation represented by the transformation table shown in FIG. 2 is carried out on the basis of Galois field transformation parameter S120b.

As shown by the transformation table in FIG. 2, input-side transformation circuit 116 outputs 8-bit data corresponding to 0, 1, $\alpha^{241}$, $\alpha^{241 \times 2}$, $\alpha^{241 \times 3}$, ... according to the 8-bit address input corresponding to 0, 1, $\beta^1$, $\beta^2$, $\beta^3$, ..., respectively.

Also, for the series as a result of processing of said Galois field $GF_a(2^8)$, any element $\alpha^{241x}$ of $GF_a(2^8)$ is transformed into the series of $GF_b(2^8)$, and, by means of output-side transformation circuit 119 that transforms 0 to 0, it is transformed into the series of original Galois field $GF_b(2^8)$. As shown in FIG. 2, output-side transformation circuit 119, which transforms from said Galois field $GF_a(2^8)$ into said Galois field $GF_b(2^8)$, outputs 8-bit data corresponding to 0, 1, $\beta^1$, $\beta^2$, $\beta^3$, ... with respect to 8-bit address input corresponding to 0, 1, $\alpha^{241}$, $\alpha^{241 \times 2}$, $\alpha^{241 \times 3}$, ... on the basis of Galois field transformation parameter S120b.

Also, because the following Equation (49) is established on the basis of said Galois field $GF_b(2^8)$, from the essence of the constitution, one may output Galois field transformation parameters S120a and 120b corresponding to the transformation table shown in FIG. 2 from parameter setting unit 120.

[Mathematical formula 49]

$$Gp_a(\beta^{91}) = 0 \quad (49)$$

Said Equations (45) and (49) form a pair in the sense that they obtain the same formulation table. In addition, there are other pairs, such as the pair of $Gp_b(\alpha^{31})=0$ and $Gp_a(\beta^{181})=0$, the pair $Gp_b(\alpha^{62})=0$ and $Gp_a(\beta^{218})=0$, etc. There are a total of 8 pairs. For the RS encoding/decoding device of this embodiment, one may use Galois field transformation parameters S120a and S120b corresponding to the transformation table with any of these pairs.

The aforementioned Galois field transformation can be described by means of 8×8 matrix.

Before starting explanation of an example, a generalization of the law of element transformation will be examined.

[Theorem 1]

m×m matrix $[H_{ba}(z)]$ that transforms Galois field $GF_b(2^m)$ into Galois field $GF_a(2^m)$ is defined by following Equation (50).

[Mathematical formula 50]

$$(\alpha^{pz})_a = [H_{ba}(z)](\beta^z)_b \quad (50)$$

In said Equation (50), z represents any integer; $(X)_a$ represents the column vector representation of element X of said Galois field $GF_a(2^m)$. Similarly, $(Y)_b$ represents the column vector representation of element Y of said Galois field $GF_b(2^m)$. That is, those are m×1 matrixes. α is a primitive element of said Galois field $Gf_a(2^m)$, and it is a root of mth field formation polynomial $GP_a(x)$ on GF(2). β is a primitive element of said Galois field $GF_b(2^m)$, and it is a root of mth field formation polynomial $Gp_a(x)$ on GF(2), and $(\beta)_b = (000 \ldots 010)^T$.

Also, on $Gp_a(2^m)$, following Equation (51) is established.

[Mathematical formula 51]

$$Gp_b(\alpha^p) = 0 \quad (51)$$

In this case, following Equation (52) is established.

[Mathematical formula 52]

$$[H_{ba}(z)] = [H_{ba}] = [(\alpha^{p(m-1)})_a (\alpha^{p(m-2)})_a \ldots (\alpha^{2p})_a (\alpha^p)_a (\alpha^0)_a] \quad (52)$$

That is, said Equation (50) is established independently of the value of z.

Said [Theorem 1] can be proved as follows.

First, because following Equation (53) is established, following Equation (54) is established using matrix $[H_{ba}]$ of said Equation (52).

[Mathematical formula 53]

$$(\beta^0)_b = (00 \ldots 001)^T \quad (53)$$
$$(\beta^1)_b = (00 \ldots 010)^T$$
$$(\beta^2)_b = (00 \ldots 100)^T$$
$$(\beta^{m-2})_b = (01 \ldots 000)^T$$
$$(\beta^{m-1})_b = (10 \ldots 000)^T$$

[Mathematical formula 54]

$$(\alpha^0)_a = [H_{ba}](\beta^0)_b \quad (54)$$
$$(\alpha^p)_a = [H_{ba}](\beta^1)_b$$
$$(\alpha^{2p})_a = [H_{ba}](\beta^2)_b$$
$$(\alpha^{p(m-2)})_a = [H_{ba}](\beta^{m-2})_b$$
$$(\alpha^{p(m-1)})_a = [H_{ba}](\beta^{m-1})_b$$

Also, for any element $\beta^z$ of said Galois field $GF_b(2^m)$, following Equation (55) is established.

[Mathematical formula 55]

$$\beta^z = \sum_{i=0}^{m-1} B_{z,i} \beta^i \quad (55)$$

Here, $B_{z,i} = 0$ or 1, and z represents any integer. Then, as said Equation (51) is established, following Equation (56) is obtained.

[Mathematical formula 56]

$$\alpha^{pz} = \sum_{i=0}^{m-1} B_{z,i} \alpha^{pi} \quad (56)$$

This can also readily seen from said Equations (47) and (48). Consequently, for the vector representation on the two sides, it is possible to transform said Equation (54) into following Equation (57).

[Mathematical formula 57]

$$(\alpha^{pz})_a = \sum_{i=0}^{m-1} B_{z,i} (\alpha^{pi})_a \quad (57)$$
$$= \sum_{i=0}^{m-1} B_{z,i} [H_{ba}](\beta^i)_b$$
$$= [H_{ba}] \sum_{i=0}^{m-1} B_{z,i} (\beta^i)_b$$

In addition, when the vector representation on the two sides of said Equation (55) is substituted into said Equation (57), the following Equation (58) is obtained.

[Mathematical formula 58]

$$(\alpha^{pz})_a = [H_{ba}](\beta^z)_b \quad (58)$$

This concludes the proof of [Theorem 1].

Also, according to said Equation (55), the following Equation (59) is established for matrix $[H_{ba}]$ with respect to $(0)_a = (000 \ldots 000)^T$ and $(0)_b = (000 \ldots 000)^T$.

[Mathematical formula 59]

$$(0)_a = [H_{ba}](0)_b \quad (59)$$

That is, all of the elements of said Galois field $Gp_a(2^m)$ are transformed into all of the elements of said Galois field $GP_b(2^m)$.

The foregoing can be summarized as follows: m of the $2^m$ input/output relationships in the input-side transformation process, for m-bit output $A_0 = (000 \ldots 001)^T$ with respect to m-bit input $(00 \ldots 0001)^T$, m-bit output $A_1 = (A_{1,m-1}, A_{1,m-2}, \ldots A_{1,0})^T$ with respect to m-bit input $(00 \ldots 0001)^T$, m-bit output $A_2 = (A_{2,m-1}, A_{2,m-2}, \ldots A_{2,0})^T$ with respect to m-bit input $(00 \ldots 0001)^T$, m-bit output $A_{m-2} = (A_{m-2,m-1}, A_{m-2,m-2}, \ldots A_{m-2,0})^T$ with respect to m-bit input $(01 \ldots 0000)^T$, and m-bit output $A_{m-1} = (A_{m-1,m-1}, A_{m-1,m-2}, \ldots A_{m-1,0})^T$ with respect to m-bit input $(10 \ldots 0000)^T$, the m×m matrix is defined by following Equation (60).

[Mathematical formula 60]

$$[H_{ba}] = (A_{m-1} \ A_{m-2} \ \ldots \ A_2 \ A_1 \ A_0) \quad (60)$$

Said input-side transformation process is realized in a calculating process for output m-bit $D_{a\_out}$ with respect to input m-bit $D_{b\_in}$ indicated by following Equation (61).

[Mathematical formula 61]

$$D_{a\_out} = [H_{ba}] \times D_{b\_in} \quad (61)$$

Input-side transformation circuit 116 performs the aforementioned input-side transformation process on the basis of Galois field transformation parameter S120a.

In the following, a specific example of input-side transformation circuit 116 when m=1, q=1, p=241 in said Equations (49)–(57) will be examined.

From the transformation table shown in FIG. 2, the following Equation (62) is established.

[Mathematical formula 62]

$$(\alpha^0)_a = A_0 = (00000001)^T \quad (62)$$
$$(\alpha^{241})_a = A_1 = (01011000)^T$$
$$(\alpha^{241 \times 2})_a = A_2 = (10010000)^T$$
$$(\alpha^{241 \times 3})_a = A_2 = (11110010)^T$$
$$(\alpha^{241 \times 4})_a = A_6 = (00001110)^T$$
$$(\alpha^{241 \times 5})_a = A_2 = (00110111)^T$$
$$(\alpha^{241 \times 6})_a = A_6 = (10110011)^T$$
$$(\alpha^{241 \times 7})_a = A_7 = (11010101)^T$$

Consequently, from said Equation (60), the following Equation (63) is established.

[Mathematical formula 63]

$$[H_{ba}] = (A_7 \ A_6 \ \ldots \ A_2 \ A_1 \ A_0) \quad (63)$$
$$= \begin{pmatrix} 1 & 1 & 0 & 0 & 1 & 1 & 0 & 0 \\ 1 & 0 & 0 & 0 & 1 & 0 & 1 & 0 \\ 0 & 1 & 1 & 0 & 1 & 0 & 0 & 0 \\ 1 & 1 & 1 & 0 & 1 & 1 & 1 & 0 \\ 0 & 0 & 0 & 1 & 0 & 0 & 1 & 0 \\ 1 & 0 & 1 & 1 & 0 & 0 & 0 & 0 \\ 0 & 1 & 1 & 1 & 1 & 0 & 0 & 0 \\ 1 & 1 & 1 & 0 & 0 & 0 & 0 & 1 \end{pmatrix}$$

In this case, when the input/output relationship indicated by said Equation (61) is shown as following Equation (64) for each bit, from Equation (65), following Equation (66) is established.

[Mathematical formula 64]

$$D_{b\_in} = (d_{b\_i7}\ d_{b\_i6}\ d_{b\_i5}\ d_{b\_i4}\ d_{b\_i3}\ d_{b\_i2}\ d_{b\_i1}\ d_{b\_i0})^T \quad (64)$$

$$D_{a\_out} = (d_{a\_o7}\ d_{a\_o6}\ d_{a\_o5}\ d_{a\_o4}\ d_{a\_o3}\ d_{a\_o2}\ d_{a\_o1}\ d_{a\_o0})$$

[Mathematical formula 65]

$$\begin{pmatrix} d_{a\_o7} \\ d_{a\_o6} \\ d_{a\_o5} \\ d_{a\_o4} \\ d_{a\_o3} \\ d_{a\_o2} \\ d_{a\_o1} \\ d_{a\_o0} \end{pmatrix} = \begin{pmatrix} 1 & 1 & 0 & 0 & 1 & 1 & 0 & 0 \\ 1 & 0 & 0 & 0 & 1 & 0 & 1 & 0 \\ 0 & 1 & 1 & 0 & 1 & 0 & 0 & 0 \\ 1 & 1 & 1 & 0 & 1 & 1 & 1 & 0 \\ 0 & 0 & 0 & 1 & 0 & 0 & 1 & 0 \\ 1 & 0 & 1 & 1 & 0 & 0 & 0 & 0 \\ 0 & 1 & 1 & 1 & 1 & 0 & 0 & 0 \\ 1 & 1 & 1 & 0 & 0 & 0 & 0 & 1 \end{pmatrix} \begin{pmatrix} d_{b\_i7} \\ d_{b\_i6} \\ d_{b\_i5} \\ d_{b\_i4} \\ d_{b\_i3} \\ d_{b\_i2} \\ d_{b\_i1} \\ d_{b\_i0} \end{pmatrix} \quad (65)$$

[Mathematical formula 66]

$$d_{a\_o7} = d_{b\_i7}\ \text{XOR}\ d_{b\_i6}\ \text{XOR}\ d_{b\_i3}\ \text{XOR}\ d_{b\_i2} \quad (66)$$

$$d_{a\_o6} = d_{b\_i7}\ \text{XOR}\ d_{b\_i3}\ \text{XOR}\ d_{b\_i1}$$

$$d_{a\_o5} = d_{b\_i6}\ \text{XOR}\ d_{b\_i5}\ \text{XOR}\ d_{b\_i3}$$

$$d_{a\_o4} = d_{b\_i7}\ \text{XOR}\ d_{b\_i6}\ \text{XOR}\ d_{b\_i5}\ \text{XOR}\ d_{b\_i3}\ \text{XOR}\ d_{b\_i2}\ \text{XOR}\ d_{b\_i1}$$

$$d_{a\_o3} = d_{b\_i4}\ \text{XOR}\ d_{b\_i1}$$

$$d_{a\_o2} = d_{b\_i7}\ \text{XOR}\ d_{b\_i5}\ \text{XOR}\ d_{b\_i4}$$

$$d_{a\_o1} = d_{b\_i6}\ \text{XOR}\ d_{b\_i5}\ \text{XOR}\ d_{b\_i4}\ \text{XOR}\ d_{b\_i3}$$

$$d_{a\_o0} = d_{b\_i7}\ \text{XOR}\ d_{b\_i6}\ \text{XOR}\ d_{b\_i5}\ \text{XOR}\ d_{b\_i0}$$

Here, XOR represents Exclusive-OR. Consequently, for example, the constitution shown in FIG. 3 may be adopted for input-side transformation circuit 116 that performs transformation of said Equation (66).

Figure 3:
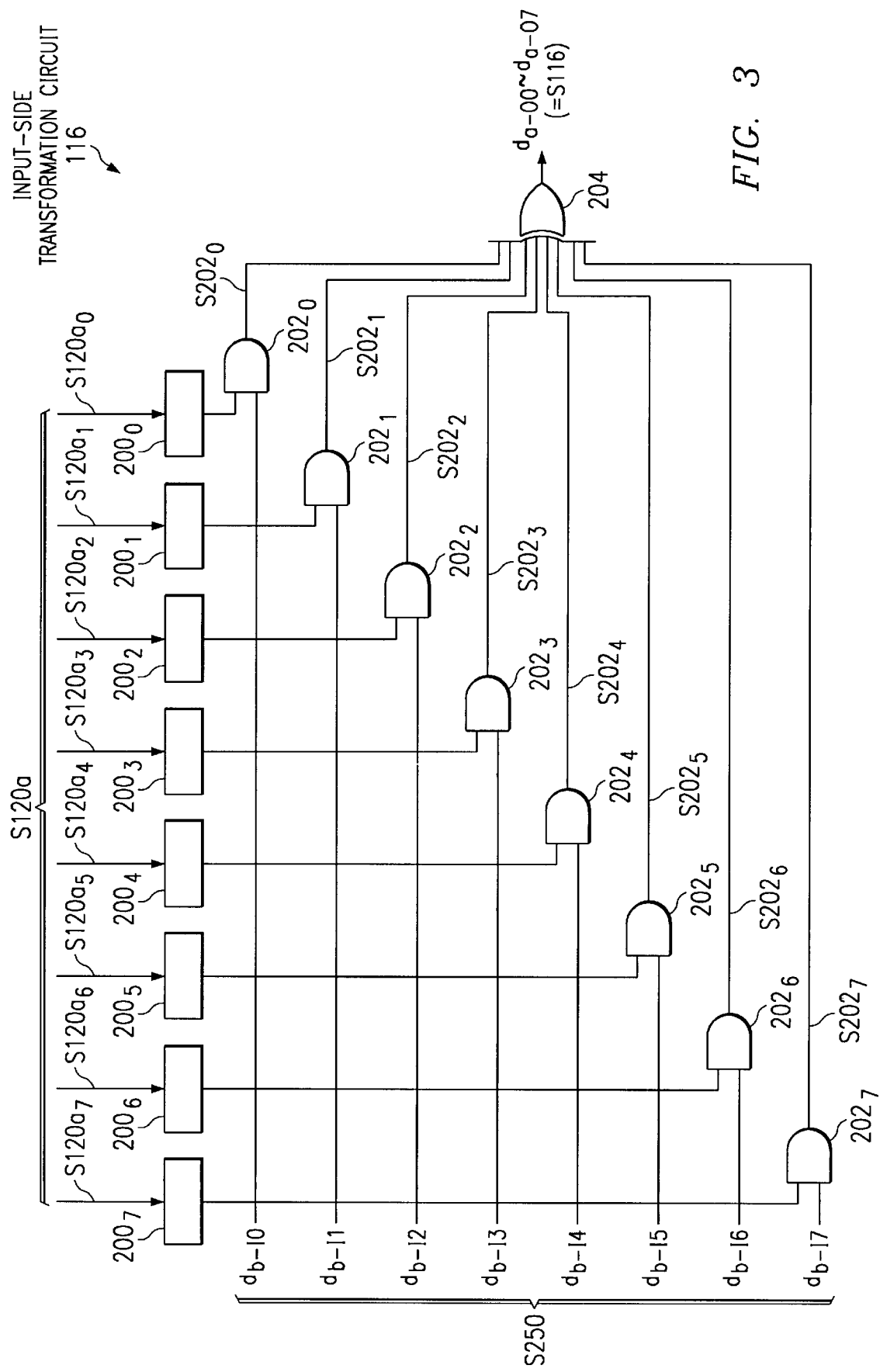
FIG. 3 is a diagram illustrating the constitution of the input-side transformation circuit shown in FIG. 1.

As shown in FIG. 3, input-side transformation circuit 116 has registers $200_0$–$200_7$, 2-input/1-output AND gates $202_0$–$202_7$, and XOR (exclusive-OR) circuit 204.

Registers $200_0$–$200_7$ input and latch bit data $S120a_0$–$S120a_7$ of Galois field transformation parameter S120a from parameter setting unit 120, and outputs them to input terminals on one side of AND gates $202_0$–$202_7$, respectively.

As explained above, for AND gates $202_0$–$202_7$, bit data $S120a_0$–$S120a_7$ are input from input terminals on one side, and bit data $d_{a\text{-}i0}$–$d_{a\text{-}i7}$ of data S250 as target of encoding/decoding are input from the input terminals on the other side, and they output their AND as data $S202_0$–$S202_7$.

XOR gates 204 performs exclusive-OR operation on data $S202_0$–$S202_7$. Data S116 consisting of bit data $d_{b\text{-}i0}$–$d_{b\text{-}i7}$ that indicate the operation result is output to RS encoding/decoding core portion 112 as shown in FIG. 1 below.

In the following, a specific example of input-side transformation circuit 116 shown in FIG. 3 will be explained. As a first example, $RS_b$ encoding and $RS_b$ decoding are performed. In this case, in input-side transformation circuit 116, arithmetic operation is performed on the basis of said Equation (65).

That is, first, as bit data that form Galois field transformation parameter S120a ($S120a_0$, $S120a_1$, $S120a_2$, $S120a_3$, $S120a_4$, $S120a_5$, $S120a_6$, $S120a_7$), the bit data of the $7^{th}$ row of said Equation (65) (1, 0, 0, 0, 0, 1, 1, 1) is input from parameter setting unit 120, and the logical AND values of said bit data (1, 0, 0, 0, 0, 1, 1, 1) and bit data ($d_{b\text{-}i0}$, $d_{b\text{-}i1}$, $d_{b\text{-}i2}$, $d_{b\text{-}i3}$, $d_{b\text{-}i4}$, $d_{b\text{-}i5}$, $d_{b\text{-}i6}$, $d_{b\text{-}i7}$) are calculated with AND gates $202_0$–$202_7$, respectively, and data $S202_0$–$S202_7$ that show said AND values are output to XOR gates 204. Then, XOR gates 204 calculates the exclusive-OR and outputs the result as data $d_{a\text{-}i0}$.

Then, as bit data that form Galois field transformation parameter S120a ($S120a_0$, $S120a_1$, $S120a_2$, $S120a_3$, $S120a_4$, $S120a_5$, $S120a_6$, $S120a_7$), the bit data of the $6^{th}$ row of said Equation (65) (0, 0, 0, 1, 1, 1, 1, 0) is input from parameter setting unit 120, and the logical AND values of said bit data (0, 0, 0, 1, 1, 1, 1, 0) and bit data ($d_{b\text{-}i0}$, $d_{b\text{-}i1}$, $d_{b\text{-}i2}$, $d_{b\text{-}i3}$, $d_{b\text{-}i4}$, $d_{b\text{-}i5}$, $d_{b\text{-}i6}$, $d_{b\text{-}i7}$) are calculated with AND gates $202_0$–$202_7$, respectively, and data $S202_0$–$S202_7$ that show said AND values are output to XOR gates 204. Then, XOR gates 204 calculates the exclusive-OR and outputs the result as data $d_{a\text{-}i1}$.

Then, as bit data that form Galois field transformation parameter S120a ($S120a_0$, $S120a_1$, $S120a_2$, $S120a_3$, $S120a_4$, $S120a_5$, $S120a_6$, $S120a_7$), the bit data of the $5^{th}$ row of said Equation (65) (0, 0, 0, 0, 1, 1, 0, 1) is input from parameter setting unit 120, and the logical AND values of said bit data (0, 0, 0, 0, 1, 1, 0, 1) and bit data ($d_{b\text{-}i0}$, $d_{b\text{-}i1}$, $d_{b\text{-}i2}$, $d_{b\text{-}i3}$, $d_{b\text{-}i4}$, $d_{b\text{-}i5}$, $d_{b\text{-}i6}$, $d_{b\text{-}i7}$) are calculated with AND gates $202_0$–$202_7$, respectively, and data $S202_0$–$S202_7$ that show said logical AND values are output to XOR gates 204. Then, XOR gates 204 calculates the exclusive-OR and outputs the result as data $d_{a\text{-}i2}$.

Then, as bit data that form Galois field transformation parameter S120a ($S120a_0$, $S120a_1$, $S120a_2$, $S120a_3$, $S120a_4$, $S120a_5$, $S120a_6$, $S120a_7$), the bit data of the $4^{th}$ row of said Equation (65) (0, 1, 0, 0, 1, 0, 0, 0) is input from parameter setting unit 120, and the logical AND values of said bit data (0, 1, 0, 0, 1, 0, 0, 0) and bit data ($d_{b\text{-}i0}$, $d_{b\text{-}i1}$, $d_{b\text{-}i2}$, $d_{b\text{-}i3}$, $db\text{-}i4$, $d_{b\text{-}i5}$, $d_{b\text{-}i6}$, $d_{b\text{-}i7}$) are calculated with AND gates $202_0$–$202_7$, respectively, and data $S202_0$–$S202_7$ that show said logical AND values are output to XOR gates 204. Then, XOR gates 204 calculates the exclusive-OR and outputs the result as data $d_{a\text{-}i3}$.

Then, as bit data that form Galois field transformation parameter S120a ($S120a_0$, $S120a_1$, $S120a_2$, $S120a_3$, $S120a_4$, $S120a_5$, $S120a_6$, $S120a_7$), the bit data of the $3^{rd}$ row of said Equation (65) (0, 1, 1, 1, 0, 1, 1, 1) is input from parameter setting unit 120, and the logical AND values of said bit data (0, 1, 1, 1, 0, 1, 1, 1) and bit data ($d_{b\text{-}i0}$, $d_{b\text{-}i1}$, $d_{b\text{-}i2}$, $d_{b\text{-}i3}$, $d_{b\text{-}i4}$, $d_{b\text{-}i5}$, $d_{b\text{-}i6}$, $d_{b\text{-}i7}$) are calculated by AND gates $202_0$–$202_7$, respectively, and data $S202_0$–$S202_7$ that show said logical AND values are output to XOR gates 204. Then, XOR gates 204 calculates the exclusive-OR and outputs the result as data $d_{a\text{-}i4}$.

Then, as bit data that form Galois field transformation parameter S120a ($S120a_0$, $S120a_1$, $S120a_2$, $S120a_3$, $S120a_4$, $S120a_5$, $S120a_6$, $S120a_7$), the bit data of the $2^{nd}$ row of said Equation (65) (0, 0, 0, 1, 0, 1, 1, 0) is input from parameter setting unit 120, and the logical AND values of said bit data (0, 0, 0, 1, 0, 1, 1, 0) and bit data ($d_{b\text{-}i0}$, $d_{b\text{-}i1}$, $d_{b\text{-}i2}$, $d_{b\text{-}i3}$, $d_{b\text{-}i4}$, $d_{b\text{-}i5}$, $d_{b\text{-}i6}$, $d_{b\text{-}i7}$) are calculated by AND gates $202_0$–$202_7$, respectively, and data $S202_0$–$S202_7$ that show said logical AND values are output to XOR gates 204. Then, XOR gates 204 calculates the exclusive-OR and outputs the result as data $d_{a\text{-}i5}$.

Then, as bit data that form Galois field transformation parameter S120a ($S120a_0$, $S120a_1$, $S120a_2$, $S120a_3$, $S120a_4$, S120$a_5$, S120$a_6$, S120$a_7$), the bit data of the 1$^{st}$ row of said Equation (65) (0, 1, 0, 1, 0, 0, 0, 1) is input from parameter setting unit 120, and the logical AND values of said bit data (0, 1, 0, 1, 0, 0, 0, 1) and bit data (d$_{b-i0}$, d$_{b-i1}$, d$_{b-i2}$, d$_{b-i3}$, d$_{b-i4}$, d$_{b-i5}$, d$_{b-i6}$, d$_{b-i7}$) are calculated by AND gates 202$_0$–202$_7$, respectively, and data S202$_0$–S202$_7$ that show said logical AND values are output to XOR gates 204. Then, XOR gates 204 calculates the exclusive-OR and outputs the result as data d$_{a-6}$.

Then, as bit data that form Galois field transformation parameter S120$a$ (S120$a_0$, S120$a_1$, S120$a_2$, S120$a_3$, S120$a_4$, S120$a_5$, S120$a_6$, S120$a_7$), the bit data of the 0$^{th}$ Equation (65) (0, 0, 1, 1, 0, 0, 1, 1) is input from parameter setting unit 120, and the logical AND values of said bit data (0, 0, 1, 1, 0, 0, 1, 1) and bit data (d$_{b-i0}$, d$_{b-i1}$, d$_{b-i2}$, d$_{b-i3}$, d$_{b-i4}$, d$_{b-i5}$, d$_{h-i6}$, d$_{b-i7}$) are calculated by AND gates 202$_0$–202$_7$, respectively, and data S202$_0$–S202$_7$ that show said logical AND values are output to XOR gates 204. Then, XOR gates 204 calculates the exclusive-OR and outputs the result as data d$_{a-i7}$.

In this way, arithmetic operation shown in said Equation (65) comes to an end.

As a second example, RS$_a$ encoding is performed. In this case, a unit matrix is used in place of matrix [H$_{ba}$] in said Equation (65). Galois field transformation parameter S120$a$ corresponding to said unit matrix is output from parameter setting unit 120 to input-side transformation circuit 116.

In this case, without transformation in input-side transformation circuit 116, data S250 is directly output as data S116.

As explained above, input-side transformation circuit 116 can perform any 8×8 matrix operation corresponding to the parameter from parameter setting unit 120. Consequently, it is possible to make use of common hardware for multiple types of RS encoding and RS decoding. As a result, compared with the case when multiple types of hardware are used corresponding to various types of RS encoding and RS decoding, it is possible to have a smaller scale and a lower cost. Also, since the arithmetic operation itself is carried out by means of hardware, it is possible to perform arithmetic operations at high speed.

In the following, output-side transformation circuit 119 will be examined.

It is possible to determine matrix [H$_{ab}$] corresponding to the output-side transformation operation by means of the inverse operation from the transformation table shown in FIG. 2. However, it is also possible to determine it directly from matrix [H$_{ba}$] that has been obtained.

That is, in the output-side transformation process, m-bit D$_{b-out}$ of output corresponding to the element of said Galois field Gp$_b$(2$^m$) is obtained with respect to m-bit D$_{a-in}$ of input corresponding to the element of said Galois field Gp$_a$(2$^m$). In this case, in said generalized Equation (61), D$_{a-out}$ is replaced with D$_{a-in}$, and D$_{b-in}$ is replaced with D$_{b-out}$, so that following Equation (67) is established. Consequently, one has:

[Mathematical formula 67]

$$D_{\text{a\_out}} = [H_{ba}] \times D_{\text{b\_in}} \qquad (67)$$

Matrix [H$_{ba}$]$^{-1}$, the inverse matrix of matrix [H$_{ba}$], is multiplied from the left side on both sides of said Equation (61), and the following Equation (68) is obtained.

[Mathematical formula 68]

$$[H_{ba}]^{-1} \times D_{\text{a\_in}} = [H_{ba}]^{-1}[H_{ba}] \times D_{\text{a\_out}} \qquad (68)$$
$$= D_{\text{b\_out}}$$

Consequently, with following Equation (69), one has following Equation (70) established.

[Mathematical formula 69]

$$[H_{ab}] = [H_{ba}]^{-1} \qquad (69)$$

[Mathematical formula 70]

$$D_{\text{b\_out}} = [H_{ab}] \times D_{\text{a\_in}} \qquad (70)$$

As an example, the following Equation (71) is obtained from matrix [H$_{ba}$] of said Equation (63).

[Mathematical formula 71]

$$[H_{ab}] = [H_{ba}]^{-1} = \begin{pmatrix} 1 & 0 & 0 & 1 & 1 & 1 & 0 & 0 \\ 0 & 1 & 1 & 0 & 1 & 1 & 0 & 0 \\ 1 & 0 & 1 & 1 & 1 & 0 & 1 & 0 \\ 0 & 0 & 1 & 0 & 0 & 0 & 1 & 0 \\ 1 & 1 & 1 & 1 & 0 & 1 & 1 & 0 \\ 1 & 0 & 0 & 0 & 0 & 1 & 1 & 0 \\ 0 & 0 & 1 & 0 & 1 & 0 & 1 & 0 \\ 0 & 1 & 0 & 0 & 1 & 0 & 1 & 1 \end{pmatrix} \qquad (71)$$

Figure 4:
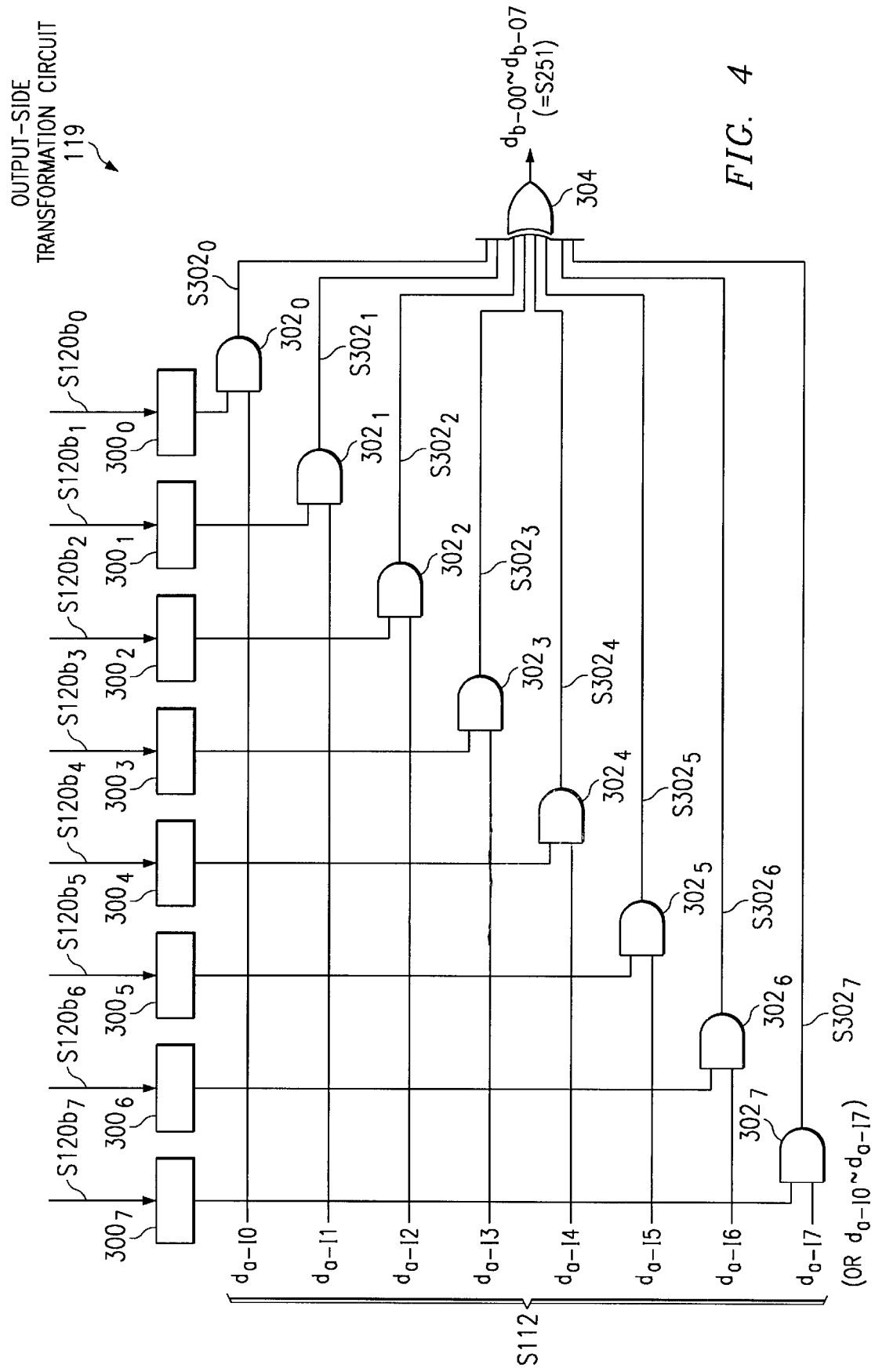
FIG. 4 is a diagram illustrating the constitution of the output-side transformation circuit shown in FIG. 1.

Similarly, by means of Galois field transformation parameter S120$b$ corresponding to said matrix [H$_{ab}$], one can realize output-side transformation circuit 119 as shown in FIG. 4.

As shown in FIG. 4, output-side transformation circuit 119 has registers 300$_0$–300$_7$, 2-input/1-output AND gates 302$_0$–302$_7$, and XOR (exclusive-OR) gate 304.

As shown in FIG. 4, output-side transformation circuit 119 has the same constitution as that of input-died transformation circuit 116 shown in FIG. 3 above.

Registers 300$_0$–300$_7$ input and latch bit data S120$b_0$–S120$b_7$ of Galois field transformation parameters S120$b$ from parameter setting unit 120, and outputs them to input terminals on one side of AND gates 302$_0$–302$_7$, respectively.

As explained above, for AND gates 302$_0$–302$_7$, bit data S120$b_0$–S120$b_7$ are input from input terminals on one side, and bit data d$_{a-i0}$–d$_{a-i7}$ of data S250 as target of encoding/decoding are input from the input terminals on the other side, and they output their logical AND values as data S302$_0$–S302$_7$.

XOR gates 304 performs the exclusive-OR operation on data S302$_0$–S302$_7$. Data S116 consisting of bit data d$_{b-i0}$–d$_{b-i7}$ that indicate the operation result is output.

As far as the operation of output-side transformation circuit 119 shown in FIG. 4 is concerned, except the contents of Galois field transformation parameter S120$b$ input from parameter setting unit 120, the operation is basically identical to that of input-side transformation circuit 116 shown in FIG. 3.

That is, when output-side transformation circuit 119 performs RS$_b$ encoding and RS$_b$ decoding, Galois field transformation parameter S120$b$ corresponding to matrix [H$_{ab}$] shown in said Equation (71) is input.

That is, when data $d_{b\text{-}00}$–$d_{b\text{-}07}$ 7 are formed, as the bit data that form Galois field transformation parameter S120$b$ (S120$b_0$, S120$b_1$, S120$b_2$, S120$b_3$, S120$b_4$, S120$b_5$, S120$b_6$, S120$b_7$), the $7^{th}$ row (1, 1, 0, 1, 0, 0, 1, 0), $6^{th}$ row (0, 1, 0, 1, 0, 1, 0, 0), $5^{th}$ row (0, 1, 1, 0, 0, 0, 1), $4^{th}$ row (0, 1, 1, 0, 1, 1, 1, 1), $3^{rd}$ row (0, 1, 0, 0, 0, 1,0, 0), $2^{nd}$ row (0, 1, 0, 1, 1, 1, 0, 1), $1^{st}$ row (0, 0, 1, 1, 0, 1, 1, 0) and $0^{th}$ row (0, 0, 1, 1, 1, 0, 0, 1) shown in said Equation (71) are input in order, followed by formation of the logical product with AND gates $302_0$–$302_7$, and the exclusive-OR operation with XOR gates 304.

On the other hand, in output-side transformation circuit 119, when $RS_a$ encoding and $RS_a$ decoding are performed, a unit matrix is used in place of matrix $[H_{ab}]$ in said Equation (70). Galois field transformation parameter S120$b$ corresponding to said unit matrix is output from parameter setting unit 120 to input-side transformation circuit 116.

In this case, without transformation in output-side transformation circuit 119, data S112 is directly output as data S251.

As explained above, output-side transformation circuit 119 can perform any 8×8 matrix operation corresponding to the parameter from parameter setting unit 120. Consequently, it is possible to make use of common hardware for multiple types of RS encoding and RS decoding. As a result, compared with the case when multiple types of hardware are used corresponding to various types of RS encoding and RS decoding, it is possible to have a smaller scale and a lower cost. Also, since the arithmetic operations are realized in hardware, it is possible to perform arithmetic operations at high speed.

RS Encoding/decoding Core Unit

In the following, the various circuits that form RS encoding/decoding core unit 112 will be explained in detail.

Surplus Arithmetic Circuit

In the following, the embodiment of the surplus arithmetic circuit of polynomial as a principal structural element of the RS encoding device will be examined. The RS encoding/decoding core unit shown in FIG. 1 has RS encoding function. Multipliers of the Galois field that forms the surplus arithmetic circuit of polynomial originally exist corresponding to $RS_a$ code. When encoding of $RS_b$ code is performed, data series $D_{a\text{-}out}$ transformed by input-side transformation circuit 116$b$ corresponds to the element of Galois field $Gp_a(2^m)$. Consequently, multiplication of said Galois field is performed according to the rule of multiplication on $Gp_a(2^m)$. Consequently, it is possible to use the same multipliers when encoding is performed for $RS_b$ code.

As explained above, because element $\beta^{pm}$ of $Gp_b(2^m)$ corresponds to $\alpha^{pm}$ on $Gp_a(2^m)$, it is necessary to perform the transformation pertaining to the multiplication coefficient of Galois field on $Gp_a(2^m)$. That is, for any integers u, v, multiplication of Galois field indicated by following Equation (72) on said $Gp_b(2^m)$ corresponds to following Equation (73) on $Gp_a(2^m)$.

[Mathematical formula 72]

$$\beta^u \times \beta^v = \beta^{u+v} \quad (72)$$

[Mathematical formula 73]

$$\alpha^{pu} \times \alpha^{pv} = \alpha^{p(u+v)} \quad (73)$$

It is clear that the division of the Galois field is the same. Also, for addition (=subtraction) of the Galois field, with reference to said Equations (55) and (56), when it is following Equation (74), following Equation (75) is obtained on $Gp_a(2^m)$.

[Mathematical formula 74]

$$\begin{aligned}\beta^u + \beta^v &= \sum_{i=0}^{m-1} B_{u,i}\beta^i + \sum_{i=0}^{m-1} B_{v,i}\beta^i \\ &= \sum_{i=0}^{m-1} (B_{u,i} + B_{v,i})\beta^i \\ &= \sum_{i=0}^{m-1} B_{w,i}\beta^i \\ &= \beta^w\end{aligned} \quad (74)$$

[Mathematical formula 75]

$$\begin{aligned}\alpha^{pu} + \alpha^{pv} &= \sum_{i=0}^{m-1} B_{u,i}\alpha^{pi} + \sum_{i=0}^{m-1} B_{v,i}\alpha^{pi} \\ &= \sum_{i=0}^{m-1} (B_{u,i} + B_{v,i})\alpha^{pi} \\ &= \sum_{i=0}^{m-1} B_{w,i}\alpha^{pi} \\ &= \alpha^{pw}\end{aligned} \quad (75)$$

As a result, usually, for the equation of F(x)=0 including any arithmetic operation, F($\beta$)=0 on $GF_b(2^m)$ corresponds to F($\alpha^p$)=0 on $GF_a(2^m)$.

Figure 12:
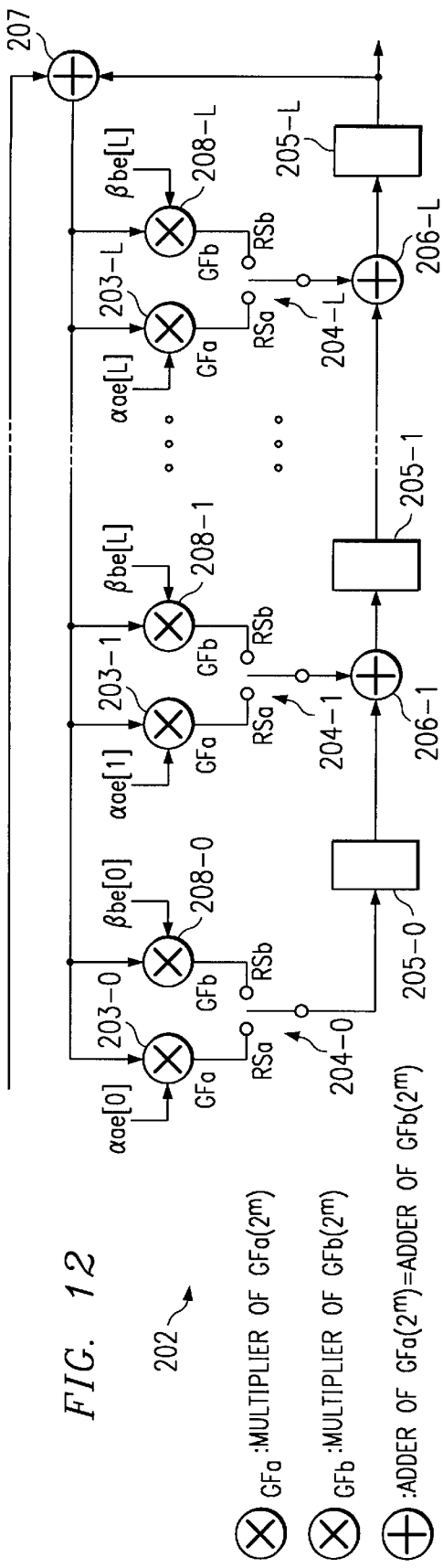
FIG. 12 is a diagram illustrating the constitution of the surplus arithmetic circuit used in the RS encoding core unit shown in FIG. 11 of the prior art.
Figure 13:
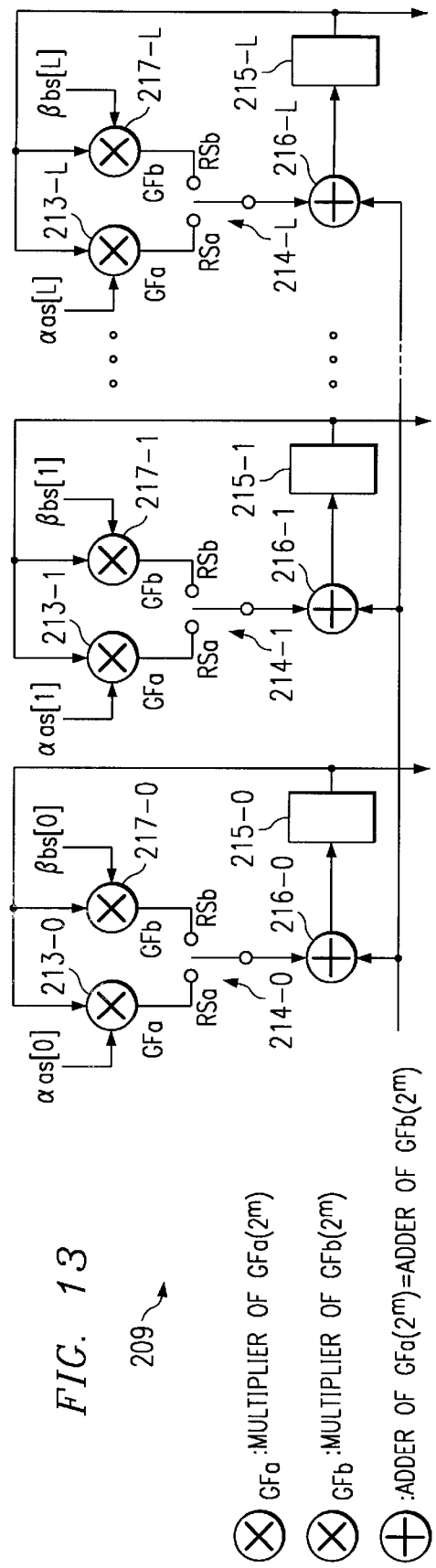
FIG. 13 is a diagram illustrating the constitution of the syndrome arithmetic circuit used in the RS decoding core unit shown in FIG. 11 of the prior art.

In the process of RS encoding, the surplus arithmetic process of polynomial due to the code forming polynomial is contained. For the multiplication coefficient in the surplus arithmetic circuit of polynomial of encoding device of the conventional $RS_b$ code shown in FIG. 12, the relationship represented by following Equation (76) is established.

[Mathematical formula 76]

$$\begin{aligned}\{\beta_{be(j)}\} &= \{\beta_{be[0]}, \beta_{be[1]}, \beta_{be[2]}, \ldots \beta_{be[L-1]}, \beta_{be[L]}\} \\ &= \{\beta^{e[0]}, \beta^{e[1]}, \beta^{e[2]}, \ldots \beta^{e[L-1]}, \beta^{e[L]}\}\end{aligned} \quad (76)$$

That is, following Equation (77) is established

[Mathematical formula 77]

$$\begin{aligned}Gc_b(x) &= \prod_{i=0}^{L} (x + \beta^{a(b+j)}) \\ &= \beta^{e[L]}x^L + \beta^{e[L-1]}x^{L-1} + \ldots \beta^{e[2]}x^2 + \beta^{e[1]}x^1 + \\ &\quad \beta^{e[0]}x^0\end{aligned} \quad (77)$$

Here, L=2t–1or 2t. From the relationship of said equation and Equations (72)–(75), the collection ($\alpha_{be[j]}$) of the multiplication coefficients of the corresponding Galois field on $GF_a(2^m)$ should meet following Equation (78).

[Mathematical formula 78]

$$\{\alpha_{be(j)}\} = \{\alpha_{be[0]}, \alpha_{be[1]}, \alpha_{be[2]}, \ldots \alpha_{be[L-1]}, \alpha_{be[L]}\} \quad (78)$$
$$= \{\alpha^{p \times e[0]}, \alpha^{p \times e[1]}, \alpha^{p \times e[2]}, \ldots \alpha^{p \times e[L-1]}, \alpha^{p \times e[L]}\}$$

In this case, corresponding code forming polynomial $Gc_{ba}(x)$ becomes following Equation (79).

[Mathematical formula 79]

$$Gcba(x) = \alpha^{p \times e[L]} x^L + \alpha^{p \times e[L-1]} x^{L-1} + \ldots \alpha^{p \times e[2]} x^2 + \alpha^{p \times e[1]} x^1 + \alpha^{p \times e[0]} x^0 \quad (79)$$
$$= \prod_{i=0}^{L} (x + \alpha^{pe(b+j)})$$

Figure 5:
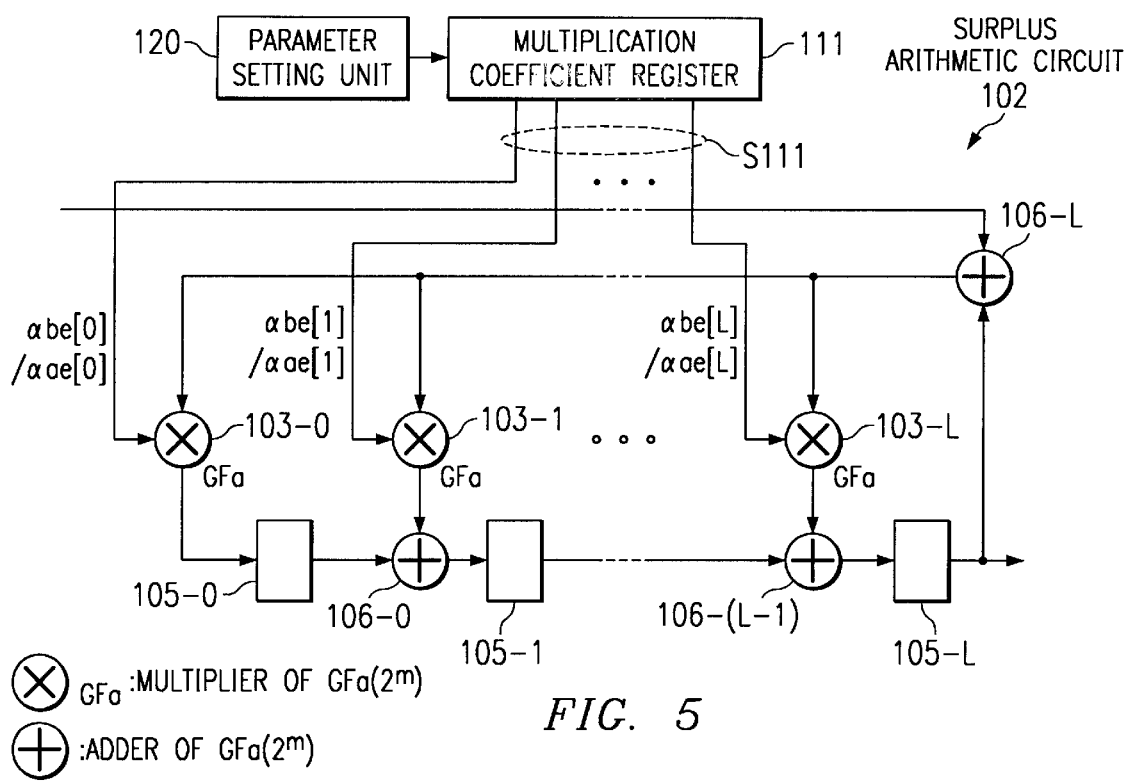
FIG. 5 is a diagram illustrating the constitution of the surplus arithmetic circuit used in the RS encoding core unit shown in FIG. 1.

That is, in this embodiment, the surplus arithmetic circuit of polynomial in the RS encoding device corresponding to two RS codes is shown in FIG. 5.

As shown in FIG. 5, surplus arithmetic circuit 102 has multipliers 103-0~103-L, registers 105-0~105-L, and adders 106-0~106-L.

Multipliers 103-0~103-L selectively have corresponding multiplication coefficients ($\alpha_{be[j]}$) and multiplication coefficients ($\alpha_{ae[j]}$) input from multiplication coefficient memory unit 111, and the results of multiplication of said input multiplication coefficients and input data are output to registers 105-0~105-L. More specifically, when $RS_a$ encoding is performed, by means of parameter setting unit 120, multiplication coefficients ($\alpha_{ae[j]}$) are output to multipliers 103-0~130-L, respectively, to perform multiplication of multiplication coefficients ($\alpha_{ae[j]}$) and input data. On the other hand, when $RS_b$ encoding is performed, by means of parameter setting unit 120, multiplication coefficients ($\alpha_{be[j]}$) are output to multipliers 103-0~130-L, respectively, and multiplication of multiplication coefficients ($\alpha_{be[j]}$) and input data is carried out.

Here, multiplication coefficients ($\alpha_{be[j]}$) are a collection of the multiplication coefficients of Galois field of the surplus arithmetic operation of polynomial corresponding to code forming polynomial $G_{Cba}$ shown in said Equation (79). Also, multiplication coefficients ($\alpha_{ae[j]}$) are a collection of the multiplication coefficients of Galois field of the surplus arithmetic operation of polynomial corresponding to code forming polynomial $G_{Ca}$ shown in said Equation (38). As shown in FIG. 5, multipliers of Galois field 103-0~103-L are multipliers on $GF_a(2^m)$, and adders of Galois field 106-0~106-L are adders on $GF_a(2^m)$.

Consequently, with respect to the surplus arithmetic circuit of the polynomial expression, which corresponds to said $RS_a$ codes that exist originally, it is possible to realize the surplus arithmetic circuits of polynomials corresponding to $RS_a$ and $RS_b$ codes at the same time by simply switching the multiplication coefficients of the Galois field. Also, as shown in FIG. 1, this embodiment may also be adopted in encoding three or more RS codes with different field formation polynomials. The larger the number, the more significant the effect. Also, it is believed that said collection ($\beta_{be[j]}$) contains 0. However, as $0^P = 0$, element of said collection ($\alpha_{be[j]}$) is still 0, and the corresponding code forming polynomial $Gc_{ba}(x)$ is still represented by said Equation (79). Also, strictly speaking, this code forming polynomial is also contained in the Goppa code.

For the example with m=8, q=88, p=241, more specifically, b=120, L=15 are substituted into said Equation (78), obtaining following Equations (80) and (81).

[Mathematical formula 80]

$$Gc_b(x) = \prod_{j=0}^{15} (x + \beta^{86(120+j)}) \quad (80)$$
$$= \beta^0 x^{15} + \beta^{30} x^{14} + \ldots + \beta^{230} x^2 + \beta^{30} x^1 + \beta^0 x^0$$

[Mathematical formula 81]

$$\{\beta_{be[1]}\} = \{\beta^0, \beta^{30}, \beta^{230}, \ldots \beta^{30}, \beta^0\} \quad (81)$$

Also, the following Equations (82) and (83) are established.

[Mathematical formula 82]

$$Gc_{ba}(x) = \prod_{j=0}^{15} (x + \alpha^{241 \times 88(120+j)}) \quad (82)$$
$$= \alpha^0 x^{15} + \alpha^{90} x^{14} + \ldots + \alpha^{95} x^2 + \alpha^{90} x^1 + \alpha^0 x^0$$

[Mathematical formula 83]

$$\{\alpha_{be[j]}\} = \quad (83)$$
$$\{\alpha^0 = \alpha^{241 \times 0}, \alpha^{90} = \alpha^{241 \times 30}, \alpha^{96} = \alpha^{241 \times 230}, \ldots \alpha^{90} = \alpha^{241 \times 30}\}$$

In this way, said Equations (76)–(79) are specified.

In this way, in this embodiment, it is possible to share multipliers of the Galois field, which have relatively large circuit scale, in encoding of $RS_a$ code and encoding of $RS_b$. More specifically, in the prior art, in order to perform encoding of $RS_b$ code, it is necessary to have 2t more multipliers of Galois field when L=2t-1. In this embodiment, however, there is no need to prepare these additional multipliers. Instead, one may simply switch the multiplication coefficients of the Galois field for division of polynomial. When m=8, multipliers of Galois field can be realized with 300–400 gates. Consequently, in this example, when t=8, it is possible to have a reduction of tens of thousands of gates.

Also, for the addition rules for Galois fields, the two Galois fields both take the field formation polynomial on the same GF(2) as the basic fields of these Galois fields. Consequently, the same addition rules apply.

RS Decoding

In the following, the case when an embodiment when said RS encoding/decoding core unit has RS decoding function as shown in FIG. 1 will be examined. In the RS decoding device, the same transformation circuit of the Galois field can also be used for input and output. Because RS decoding is performed with the sum of multiplication of Galois fields and multiplication or division circuit of polynomials, by means of the same constitution for the transformation of multiplication coefficients of the Galois field as that of the RS encoding device, it is possible to realize an RS decoding device corresponding to two or more RS codes with shared multipliers of Galois field. That is, multiplication coefficient memory unit 111 has a collection $\{\alpha_{a[I]}\}$ of multiplication coefficients of Galois field corresponding to decoding of $RS_a$ code, and a collection $\{\alpha_{b[J]}\}$ of multiplication coefficients of Galois field corresponding to decoding of $RS_b$ code. By means of parameter setting unit 120, when decoding of $RS_a$ is performed, collection of multiplication coefficients $\{\alpha_{a[I]}\}$ is output as multiplication coefficient S111 to RS encoding/decoding core unit 112, and, when decoding of $RS_b$ is performed, the collection of multiplication coefficients $\{\alpha_{b[I]}\}$ is output as multiplication coefficient S111 to RS encoding/decoding core unit 112.

Decoding of $RS_b$ code is performed on $GF_a(2^m)$ according to said Equation (79). That is, although strictly speaking, decoding of Goppa code is performed, a Euclidean decoding method can be adopted as the method.

Syndrome Arithmetic Circuit

Figure 6:
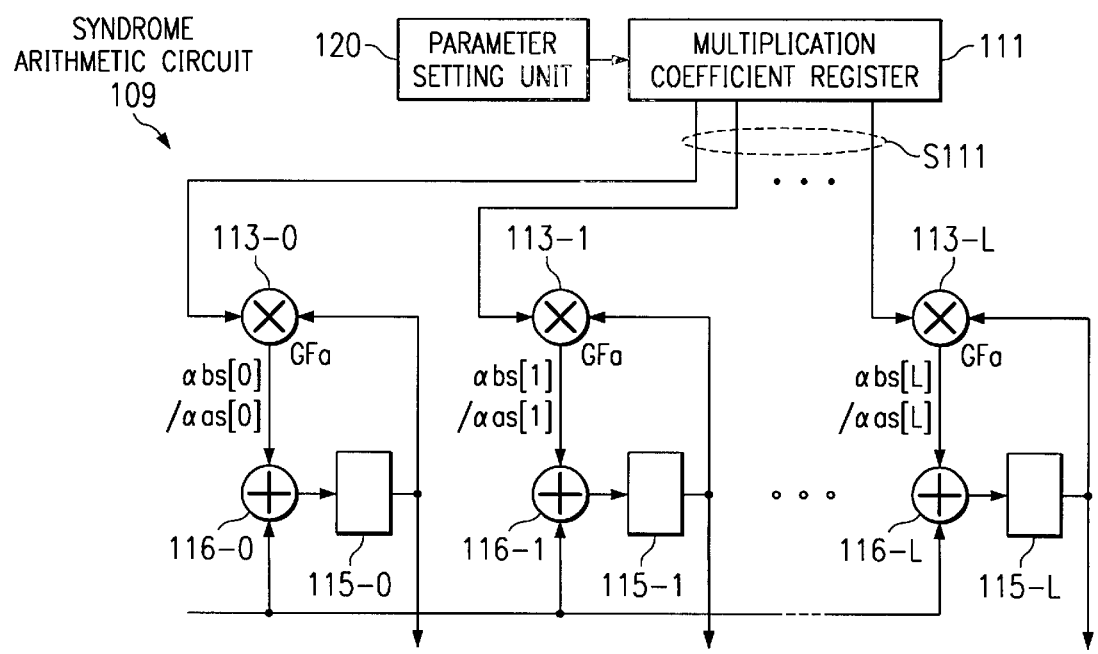
FIG. 6 is a diagram illustrating the constitution of the syndrome arithmetic circuit used in the RS decoding core unit shown in FIG. 1.

FIG. 6 is a diagram illustrating the embodiment of syndrome arithmetic circuit 109 corresponding to said two RS codes. Here, collection of multiplication coefficients of Galois field $\{\alpha aE[i]\}$, i=0–L is contained in said $\{\alpha_{b[J]}\}$, and collection of multiplication coefficients of Galois field $\{\alpha_{bE[j]}\}$, j=0–L is contained in said $\{ab[J]\}$. In addition, for $RS_b$, an example with m=8, q=88, p=241, b=120, L=15 is shown in following Equation (84).

[Mathematical formula 84]

$$\{\alpha_{bs[j]}\} = \{\alpha_{bs[0]}, \alpha_{bs[1]}, \alpha_{bs[2]}, \ldots \alpha_{bs[L-1]}, \alpha_{bs[L]}\} \quad (84)$$
$$= \{\alpha^{241\times88\times120}, \alpha^{241\times88\times121}, \alpha^{241\times88\times122}, \ldots$$
$$\alpha^{241\times88\times134}, \alpha^{241\times88\times135}\}$$
$$= \{\alpha^{80}, \alpha^{103}, \alpha^{146}, \ldots \alpha^{152}, \alpha^{195}\}$$

As shown in FIG. 6, syndrome arithmetic circuit 109 has multipliers 113-0~113-L, registers 115-0~115-L, and adders 116-0~116-L.

Multipliers 113-0~113-L selectively have corresponding multiplication coefficients $\{\alpha_{bs[j]}\}$ and multiplication coefficients $\{\alpha_{as[j]}\}$ input from multiplication coefficient memory unit 111 under control of parameter setting unit 120, and the results of multiplication of said selected multiplication coefficients and the data from registers 115-0~115-L are output to registers 116-0~116-L. More specifically, when $RS_a$ encoding is performed, multiplication coefficients $\{\alpha_{as[j]}\}$ are output from multiplication coefficient memory unit 111 to multipliers 113-0~113-L, respectively, to perform multiplication of multiplication coefficients $\{\alpha_{as[j]}\}$ and the data from registers 115-0~115-L. On the other hand, when $RS_b$ encoding is performed, multiplication coefficients $\{\alpha_{bs[j]}\}$ are output from multiplication coefficient memory unit 111 to multipliers 113-0~113-L, respectively, and multiplication of multiplication coefficients $\{\alpha_{bs[j]}\}$ and the data from registers 115-0~115-L is carried out.

Here, multiplication coefficients $\{\alpha_{as[j]}\}$ are a collection of the multiplication coefficients of Galois field of the syndrome arithmetic operation corresponding to $RS_a$. Also, multiplication coefficients $\{\alpha_{bs[j]}\}$ are a collection of the multiplication coefficients of Galois field of the syndrome arithmetic operation of corresponding to $RS_b$. As shown in FIG. 6, multipliers of Galois field 113-0~113-L are multipliers on $GF_a(2^m)$, and adders of Galois field 116-0~116-L are adders on $GF_a(2^m)$.

Polynomial Division Circuit

Figure 7:
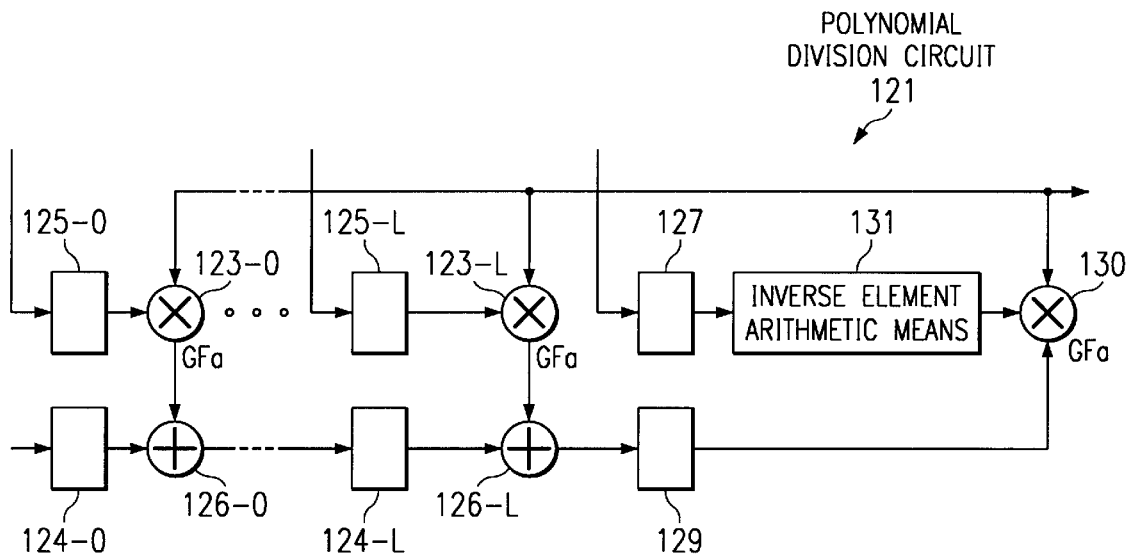
FIG. 7 is a diagram illustrating the constitution of the division circuit used in the RS decoding core unit shown in FIG. 1.

FIG. 7 is a diagram illustrating an embodiment of division circuit 121 of the polynomial expression corresponding to said two RS codes and as one of the principal elements of the error location polynomial and evaluation polynomial arithmetic circuit.

As shown in FIG. 7, polynomial division circuit 121 has multipliers 123-0~123-L, registers 124-0~124-L, registers 125-0~125-L, registers 127, 129, adders 126-0~126-L, multiplier/adder 130 and inverse element arithmetic circuit 131.

Figure 14:
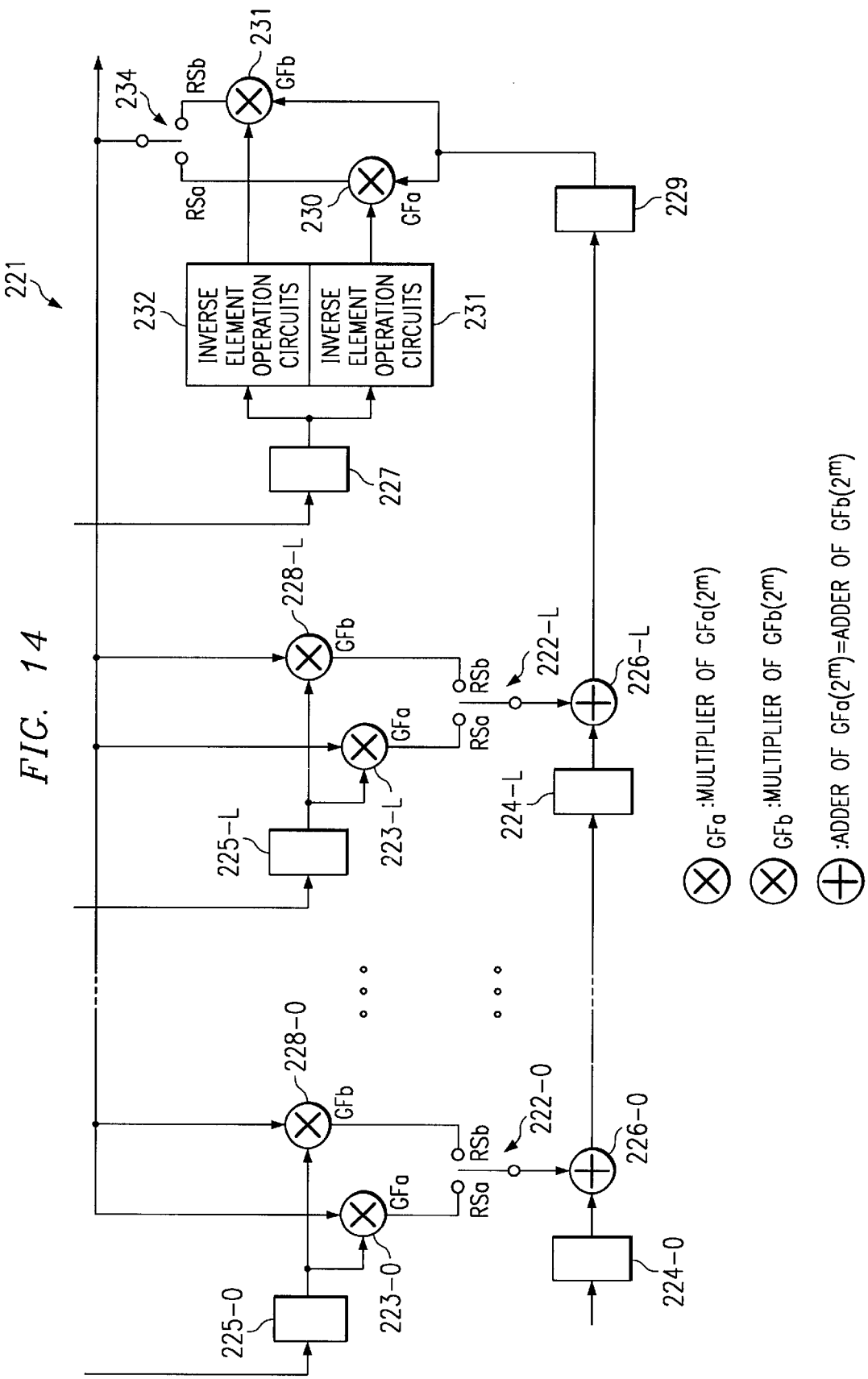
FIG. 14 is a diagram illustrating the constitution of the division circuit used in the RS decoding core unit shown in FIG. 11 of the prior art.

In this case, as can be seen from a comparison with the conventional polynomial division circuit shown in FIG. 14, in the present embodiment, there is no need to switch the multipliers of the Galois field. Also, only one inverse element arithmetic circuit is required. That is, when the correction power is the same for the aforementioned two RS codes, operations can be realized with the same circuit.

Polynomial Multiplication Circuit

Figure 8:
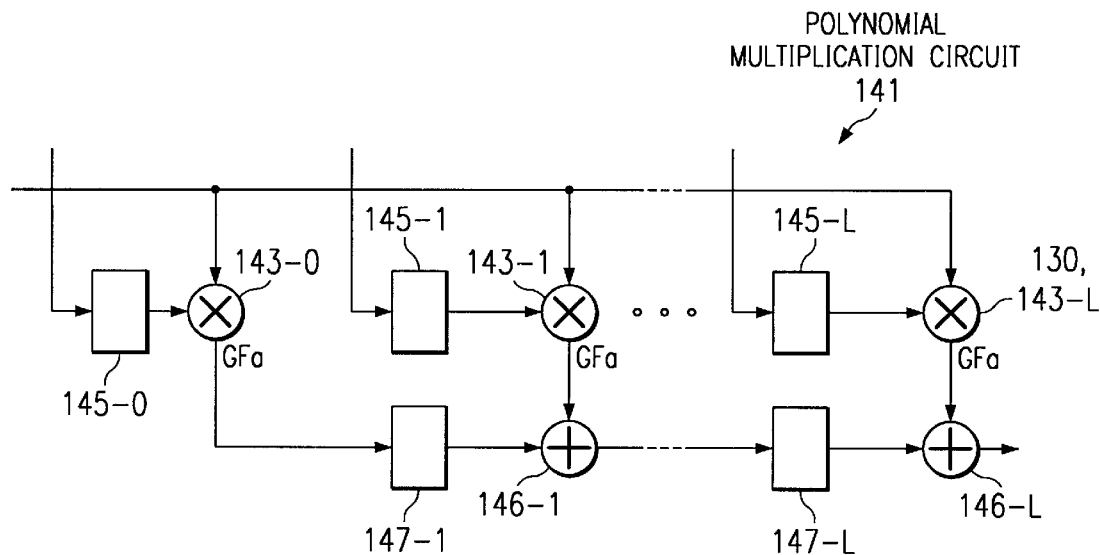
FIG. 8 is a diagram illustrating the constitution of the multiplication circuit used in the RS decoding core unit shown in FIG. 1.

FIG. 8 is a diagram illustrating an embodiment of multiplication circuit 141 of the polynomial expression corresponding to said two RS codes and as one of the principal elements of the error location polynomial and evaluation polynomial arithmetic circuit.

As shown in FIG. 8, polynomial multiplication circuit 141 has multipliers 143-0~143-L, registers 145-0~145-L, adders 146-1~146-L, and registers 147-1~147-L.

Figure 15:
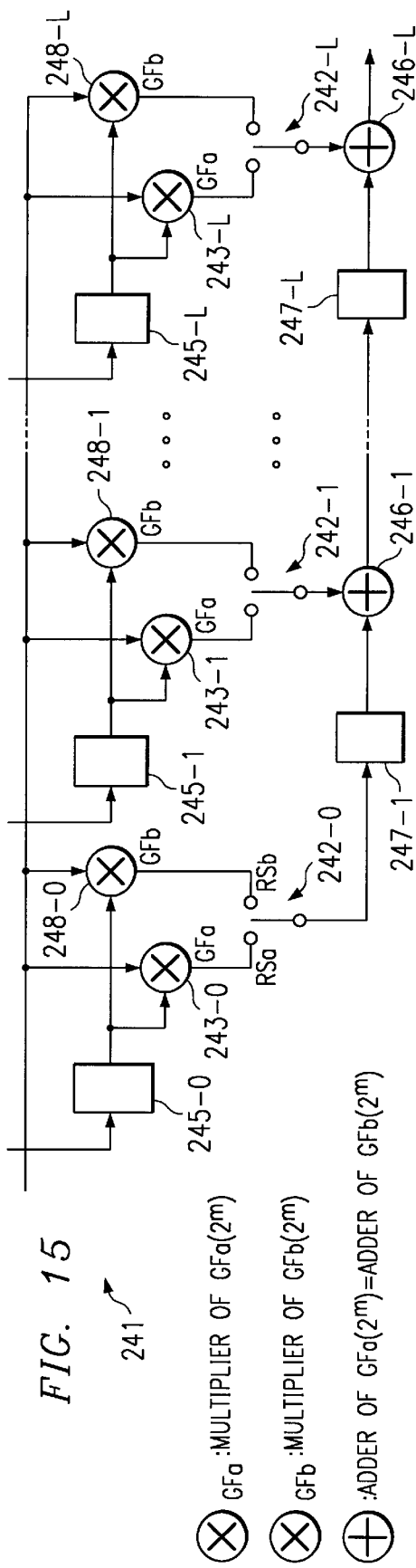
FIG. 15 is a diagram illustrating the constitution of the multiplication circuit used in the RS decoding core unit shown in FIG. 11 of the prior art.
Figure 16:
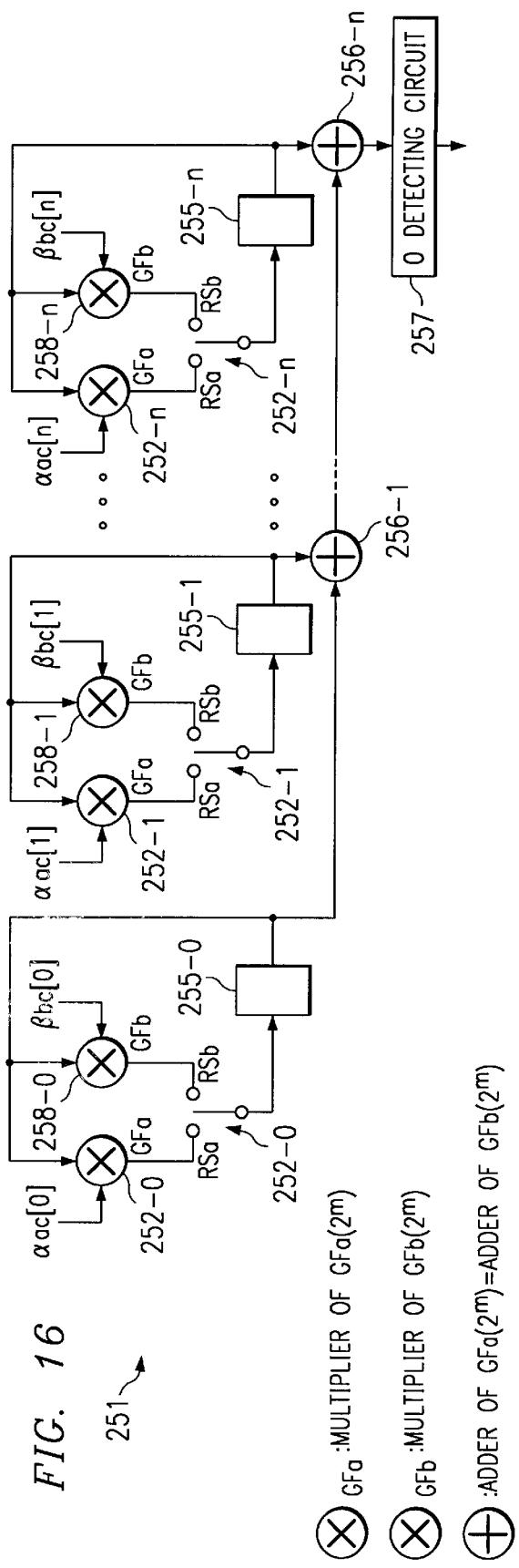
FIG. 16 is a diagram illustrating the constitution of the location detecting circuit used in the RS decoding core unit shown in FIG. 11 of the prior art.
Figure 17:
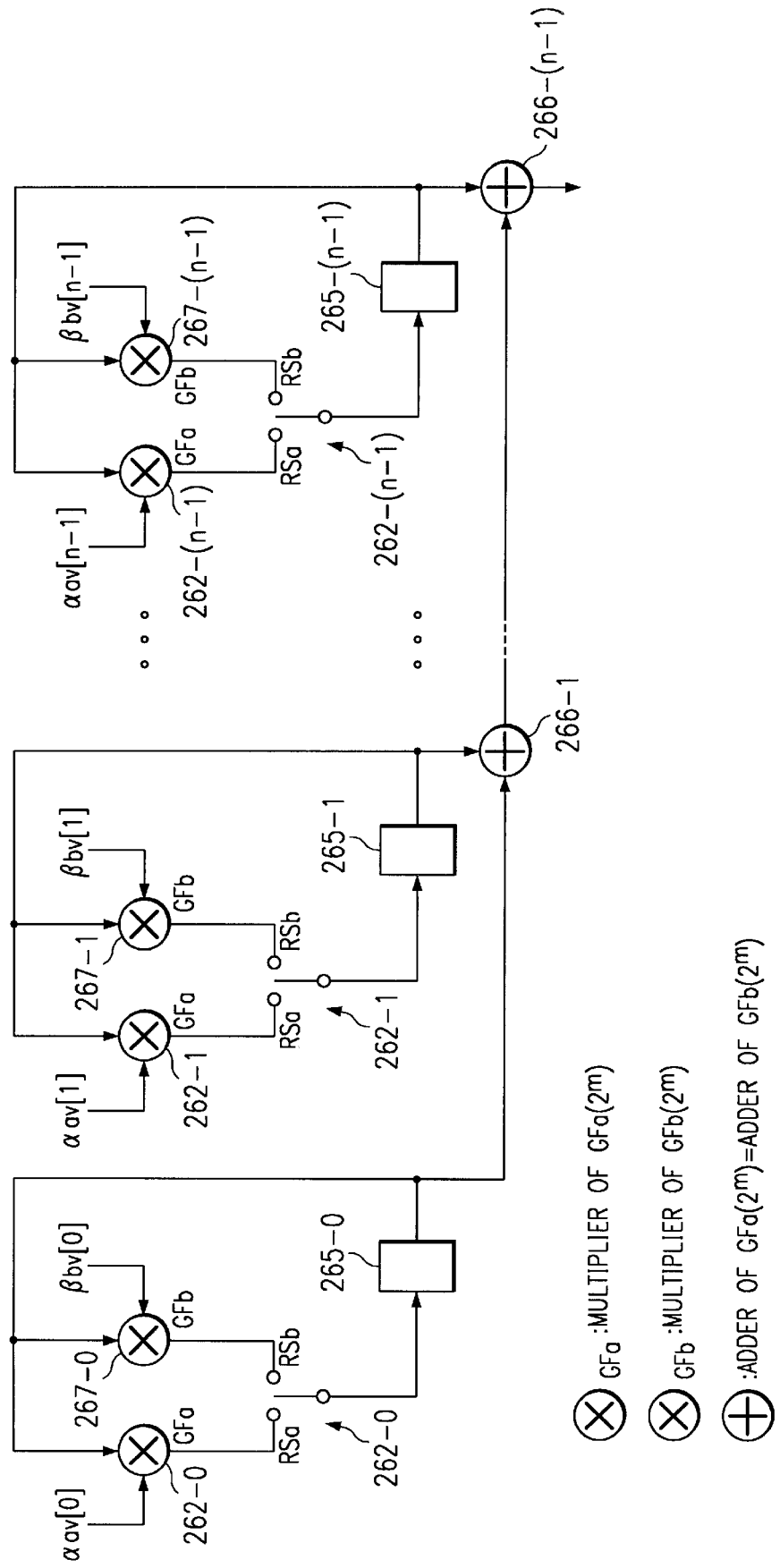
FIG. 17 is a diagram illustrating the constitution of the evaluation value detecting circuit used in the RS decoding core unit shown in FIG. 11 of the prior art.

For polynomial multiplication circuit 141, multiplication is entirely performed according to the arithmetic rule for $GP_a(2^m)$. Consequently, the number of multipliers of Galois field can be cut in half compared with the conventional polynomial multiplication circuit shown in FIG. 15, when they have the same correction power for said two RS codes.

Error Location Detecting Circuit

In the prior art, according to the Chien search algorithm, detection of error location is carried out by sequentially substituting $\beta^{-qk}$ corresponding to location k into error location polynomial $\sigma_b(X)$ shown in following Equation (85) and found by means of said error location arithmetic circuit. As shown in following Equation (86), if its value becomes 0, it is determined that there is an error at said location k. In this case, when the erasure correction is performed, n=2t, and when the erasure correction is not performed, n=t.

[Mathematical formula 85]

$$\sigma_b(x) = \sigma_{b[n]}x^n + \sigma_{b[n-1]}x^{n-1} + \ldots + \sigma_{b[2]}x^2 + \quad (85)$$
$$\sigma_{b[1]}x^1 + \sigma_{b[0]}x^0$$

[Mathematical formula 86]

$$\sigma_b(\beta^{-qk}) = 0 \quad (86)$$

In this embodiment, $\beta^{-qk}$ corresponding to said error location k corresponds to $\alpha^{p(-qk)}$, and there are relationships represented by said Equations (72)–(75) for the arithmetic operation. Consequently, in this embodiment, the error location polynomial is represented by following Equation (87).

[Mathematical formula 87]

$$\sigma(x) = \sigma_n x^n + \sigma_{n-1} x^{n-1} + \ldots + \sigma_2 x^2 + \sigma_1 x^1 + \sigma_0 x^0 \quad (87)$$

In this case, when the coefficient of Galois field $GF_b(2^m)$ of said Equation (86) $\sigma_{b[j]}=\beta^{c[j]}$ or 0, the coefficient of Galois field $GF_a(2^m)$ of said Equation (86) $\sigma_j=\alpha^{pc[j]}$ or 0. Consequently, for k for which said Equation (85) is established, the following Equation (88) is established.

[Mathematical formula 88]

$$\sigma(\alpha^{pqk}) = 0 \qquad (88)$$

That is, in this embodiment, there is an error at location k where Equation (88) is established. Also, the same conclusion is reached as one considers decoding the Goppa code by means of the code forming polynomial of said Equation (79) using the method described in said reference.

Figure 9:
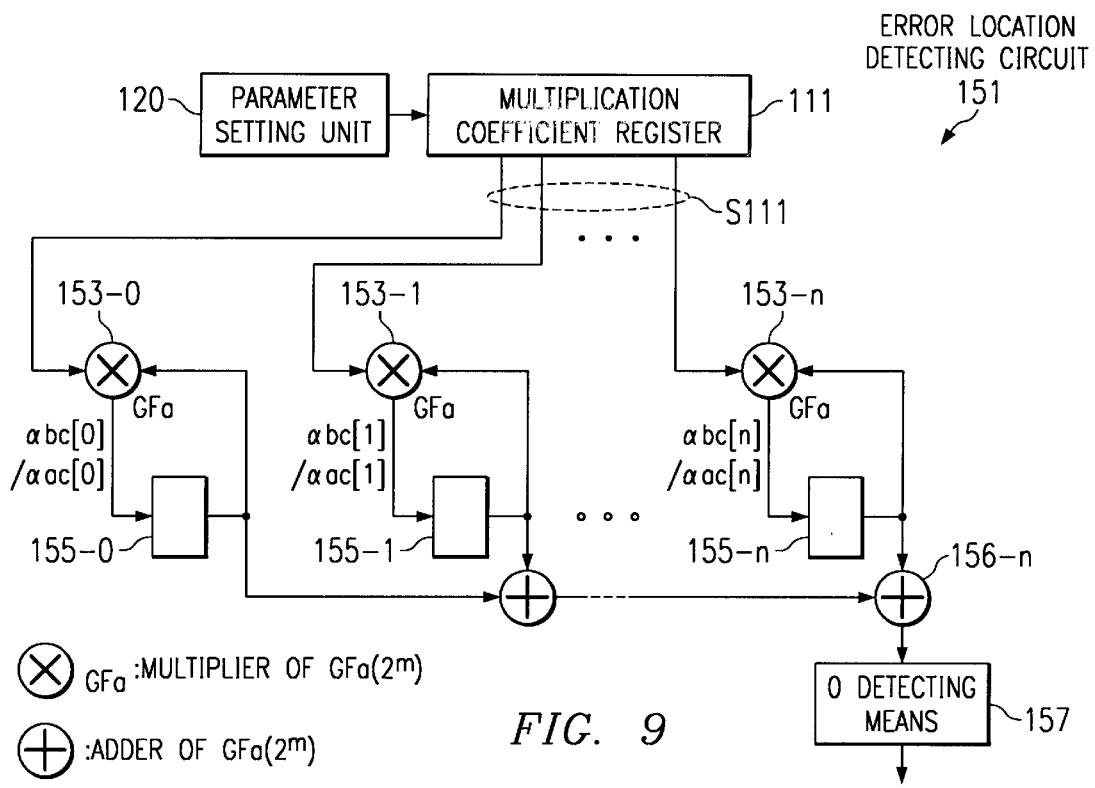
FIG. 9 is a diagram illustrating the constitution of the location detecting circuit used in the RS decoding core unit shown in FIG. 1.

FIG. 9 is a diagram illustrating the constitution of error location detecting circuit 151 pertaining to this embodiment, corresponding to the above-mentioned two RS codes. Error location detecting circuit 151 is for realizing the Chien search algorithm corresponding to said Equation (87). By simply switching coefficients, it is possible to handle both of said RS codes. Here, when erasure correction is not performed, one has n=t, the collection of multiplication coefficients of Galois field $\{\alpha_{ac[i]}\}$, i=0~t is contained in said $\{\alpha_{a[J]}\}$, and the collection of multiplication coefficients of Galois field $\{\alpha_{bc[i]}\}$, i=0~t is contained in said $\{\alpha_{b[J]}\}$.

As shown in FIG. 9, error location detecting circuit 151 has multipliers 153-0~153-n, registers 155-~0155-n, adders 156-1~156-n, and 0 detecting circuit 157. In error location detecting circuit 151, error location k is determined on the basis of the detection result from 0 detecting circuit 157.

Here, multipliers 153-0~153-n are multipliers of $GF_a(2^m)$, and adders 156-1~156-n are adders of $GF_a(2^m)$.

In addition, for the example with m=8, q=88, p=241, b=120, L=15(t=8) for $RS_b$ code, following Equation (89) is established.

[Mathematical formula 89]

$$\{\alpha_{bc[j]}\} = \{\alpha_{bc[0]}, \alpha_{bc[1]}, \alpha_{bc[2]} \ldots \alpha_{bc[n-1]}, \alpha_{bc[n]}\} \qquad (89)$$
$$= \{\alpha^{241 \times 88 \times 255}, \alpha^{241 \times 88 \times 254}, \alpha^{241 \times 88 \times 263},$$
$$\ldots \alpha^{241 \times 88 \times 248}, \alpha^{241 \times 88 \times 247}\}$$

One can set coefficients $\sigma_0$–$\sigma_n$ of said Equation (87) as initial values of the various registers, and calculate the values corresponding to the left-hand side of said Equation (88) corresponding to k=0, 1, 2 . . . successively. Also, when erasure correction is performed by means of $RS_b$, one has j=0–2t (that is, n=2t).

In this case, too, when $RS_a$ decoding is performed under the control of parameter setting unit 120, multiplication coefficients $\alpha_{ac[I]}$ are output from multiplication coefficient memory unit 111 to multipliers 153-0~153-n. When $RS_b$ decoding is performed under the control of the parameter setting unit, multiplication coefficients $\alpha_{bc[I]}$ are output from multiplication coefficient memory unit 111 to multipliers 153-0~153-n.

Evaluation Value Detecting Circuit

In order to perform error correction, in addition to error location k, it is necessary to find error magnitude $e_k$. The evaluation function is represented by following Equation (90).

[Mathematical formula 90]

$$\eta(x) = \eta_{n-1}x^{n-1} + \eta_{n-2}x^{n-1} + \ldots + \eta_2 x^2 + \eta_1 x^1 + \eta_0 x^0 \qquad (90)$$

Also, if the derivative of said location polynomial is $\sigma'(x)$, and the decoding of Goppa code by means of the code forming polynomial of said Equation (79) is carried out according to the aforementioned reference, the magnitude of said error is represented by following Equation (91).

[Mathematical formula 91]

$$e_k = \frac{\alpha^{pq(b-1)(-k)}\eta(\alpha^{-pqk})}{\sigma \cdot (\alpha^{-pqk})} \qquad (91)$$

Figure 10:
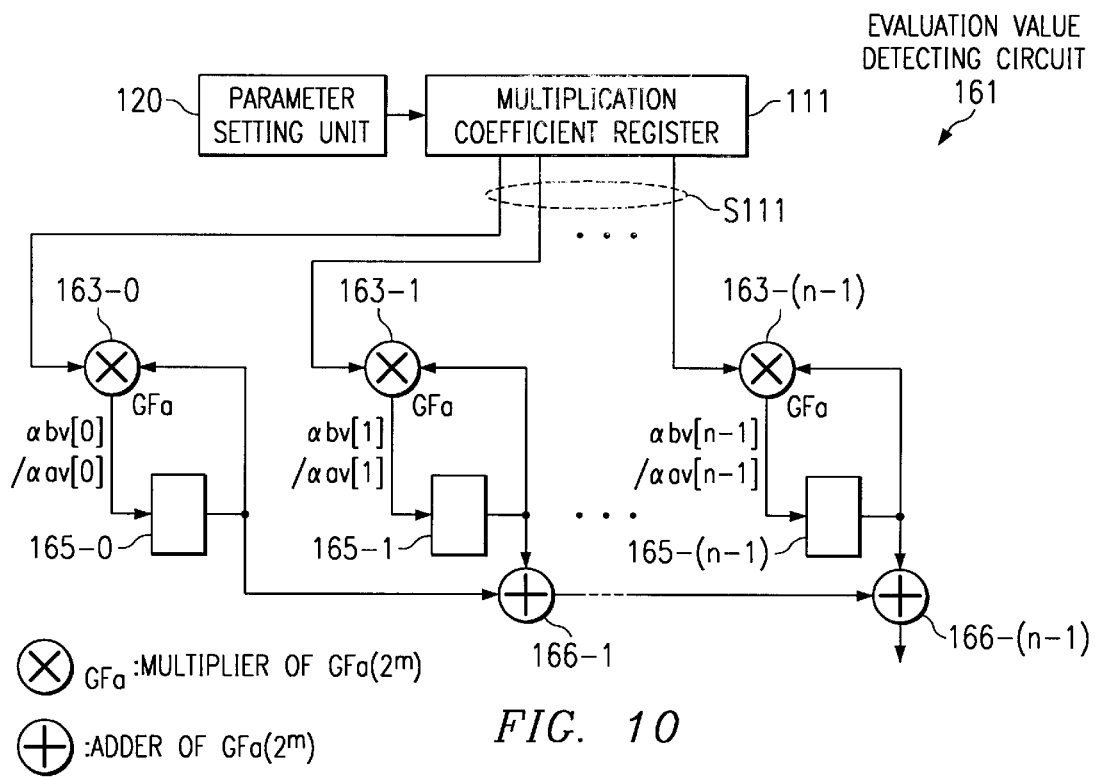
FIG. 10 is a diagram illustrating the constitution of the evaluation value detecting circuit used in the RS decoding core unit shown in FIG. 1.
Figure 11:
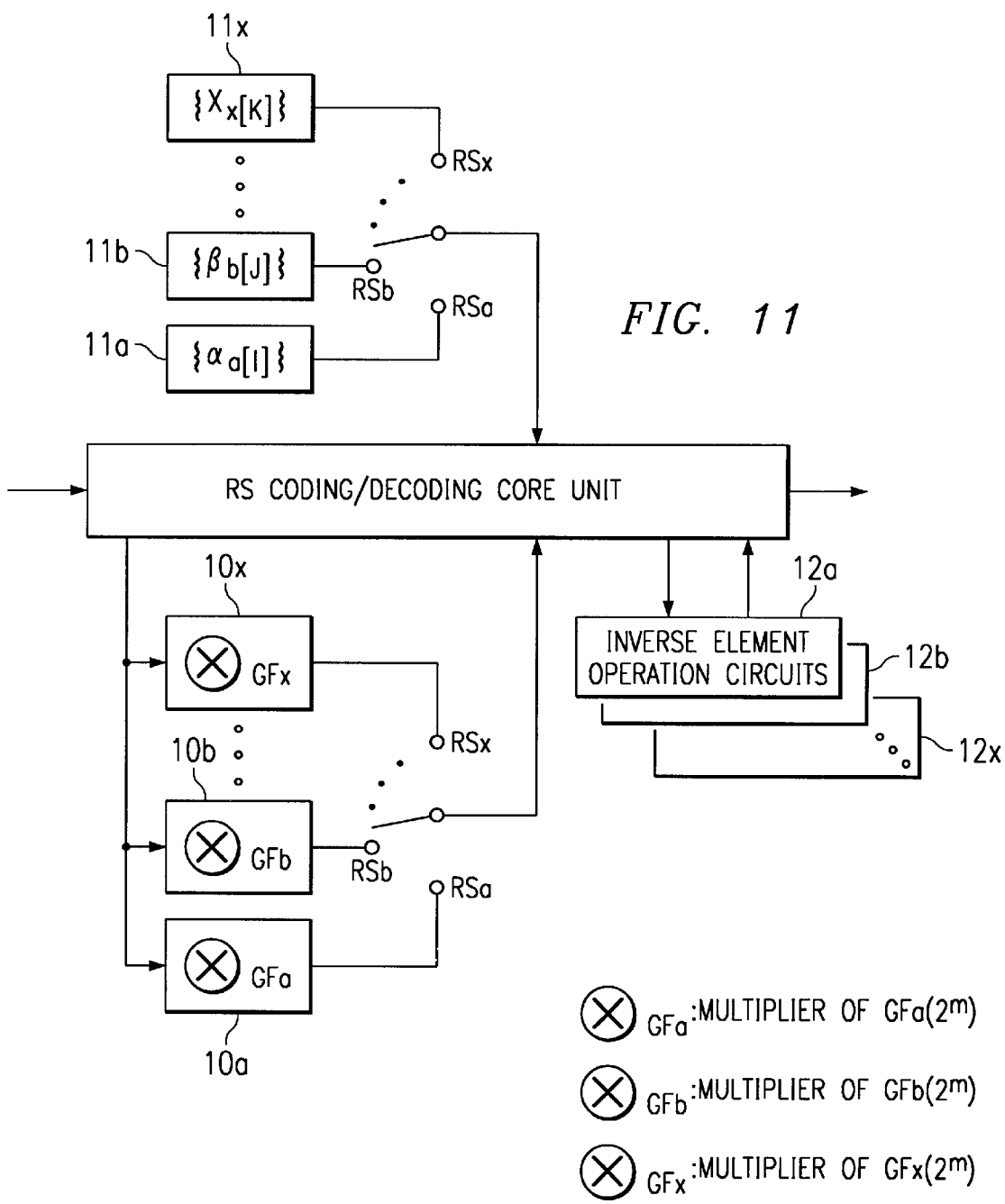
FIG. 11 is a schematic diagram illustrating a conventional RS encoding/decoding device.

FIG. 10 is a diagram illustrating an embodiment of the evaluation value detecting circuit proposed corresponding said two RS codes.

As shown in FIG. 10, evaluation value detecting circuit 161 has multipliers 163-0~163-(n-1), registers 165-0~165-(n-1), and adders 166-1~166-(n-1).

In this case, when erasure correction is not performed, n=t, and collection of multiplication coefficients of Galois field $\{\alpha_{av[i]}\}$, i=0~t is contained in said $\{\alpha_{a[J]}\}$, and collection of multiplication coefficients of Galois field $\{\alpha_{bv[i]}\}$, j=0~t-1 is contained in said $\{\alpha_{b[J]}\}$.

Under the control of parameter setting unit 120, multipliers 163-0~163-(n-1) selectively have corresponding multiplication coefficients $\{\alpha_{bv[j]}\}$ and multiplication coefficients $\{\alpha_{av[j]}\}$ input from multiplication coefficient memory unit 111, and perform multiplication of the selected multiplication coefficients and the data from registers 165-0~165-(n-1). More specifically, when $RS_a$ decoding is performed, multiplication coefficients $\{\alpha_{av[j]}\}$ are output to multipliers 163-0~163-(n-1), and multiplication of multiplication coefficients $\{\alpha_{av[j]}\}$ and the data from registers 165-0~165-(n-1) is carried out. On the other hand, when $RS_b$ decoding is performed, multiplication coefficients $\{\alpha_{bv[j]}\}$ are output to multipliers 163-0~163-(n-1), and multiplication of multiplication coefficients $\{\alpha_{bv[j]}\}$ and the data from registers 165-0~165-(n-1) is carried out.

In addition, as an example with m=8, q=88, p=241, b=120, and L=15 (t=8) for $RS_b$ code, one has following Equation (92).

[Mathematical formula 92]

$$\{\alpha_{bv[j]}\} = \{\alpha_{bv[0]}, \alpha_{bv[1]}, \alpha_{bv[2]} \ldots \alpha_{bv[t-2]}, \alpha_{bv[t-1]}\} \qquad (92)$$
$$= \{\alpha^{241 \times 88 \times 255}, \alpha^{241 \times 88 \times 254}, \alpha^{241 \times 88 \times 263},$$
$$\ldots \alpha^{241 \times 88 \times 249}, \alpha^{241 \times 88 \times 248}\}$$

By setting coefficients $\eta_0$–$\eta_{t-1}$ of said Equation (87) as the initial values of the registers, one can successively derive the values of $\eta(\alpha^{-pqk})$ of said Equation (91) corresponding to k=0, 1, 2, . . . .

Or, because the value of the numerator of said Equation (91) is represented by following Equation (93),

[Mathematical formula 93]

$$\alpha^{pn(b-1)(-k)}\eta(\alpha^{-pqk}) = \alpha^{pq(b-1)(-k)}\{\eta_{t-1}\alpha^{-pqk(t-1)} + \qquad (93)$$
$$\eta_{t-2}\alpha^{-pqk(t-2)} + \ldots + \eta_2\alpha^{-pqk \times 2} +$$
$$\eta_1\alpha^{-pqk} + \eta_0\}$$
$$= \eta_{t-1}\alpha^{-pq(t+b-2)k} + \eta_{t-2}\alpha^{-pq(t+b-3)k} +$$
$$\ldots + \eta_2\alpha^{-pq(b+1)k} + \eta_1\alpha^{-pqbk} +$$
$$\eta_0\alpha^{-pq(b-1)k}$$

As an example with m=8, q=88, p=241, b=120, and L=15 (t=8) for $RS_b$ code, one has following Equation (94).

[Mathematical formula 94]

$$\{\alpha_{bv[j]}\} = \{\alpha_{bv[0]}, \alpha_{bv[1]}, \alpha_{bv[2]}, \ldots \alpha_{bv[t-2]}, \alpha_{bv[t-1]}\} \quad (94)$$
$$= \{\alpha^{241\times88\times(255-119)}, \alpha^{241\times88\times(254-119)}, \alpha^{241\times88\times(262-119)},$$
$$\ldots \alpha^{241\times88\times(249-119)}, \alpha^{241\times88\times(248-119)}\}$$

The values of the numerator of said Equation (91) are found successively. In addition, in light of the fact that the derivative σ'(x) of the polynomial of said equation and the polynomial $\sigma_{odd}(x)$ of the sum of the odd-numbered items of said location polynomial is following Equation (95),

[Mathematical formula 95]

$$\sigma'(x) = x\sigma_{odd}(x) \quad (95)$$

The aforementioned Equation (91) can be rearranged into the following Equation (96).

[Mathematical formula 96]

$$ek = \frac{\alpha^{pq(b-1)(-k)}\eta(\alpha^{-pqk})}{\sigma\cdot(\alpha^{-pqk})} \quad (96)$$
$$= \frac{\alpha^{pq(b-1)(-k)}\eta(\alpha^{-pqk})}{\alpha^{-pqk}\sigma_{odd}(\alpha^{-pqk})}$$
$$= \frac{\alpha^{-pqbk}\eta(\alpha^{-pqk})}{\sigma_{odd}(\alpha^{-pqk})}$$

Because it is possible to derive the value of this denominator easily in the process when the error location is determined using said Equation (88), the efficiency is even higher. Because the value of the numerator of said Equation (96) is represented by following Equation (97),

[Mathematical formula 97]

$$\alpha^{-pqbk}\eta(\alpha^{-pqk}) = \alpha^{-pqbk}\{\eta_{t-1}\alpha^{-pqk(t-1)} + \eta_{t-2}\alpha^{-pqk(t-2)} + \ldots + \quad (97)$$
$$\eta_2\alpha^{-pqk\times2} + \eta_1\alpha^{-pqk} + \eta_0\}$$
$$= \eta_{t-1}\alpha^{-pq(t+b-1)k} + \eta_{t-2}\alpha^{-pq(t+b-2)k} + \ldots +$$
$$\eta_2\alpha^{-pq(h+2)k} + \eta_1\alpha^{-pq(b+1)k} + \eta_0\alpha^{-pqbk}$$

As an example with m=8, q=88, p=241, b=120, and L=15(t=8) for $RS_b$ code, on has the following Equation (98).

[Mathematical formula 98]

$$\{\alpha_{bv[j]}\} = \{\alpha_{bv[0]}, \alpha_{bv[1]}, \alpha_{bv[2]}, \ldots \alpha_{bv[t-2]}, \alpha_{bv[t-1]}\} \quad (98)$$
$$= \{\alpha^{241\times88\times(253-120)}, \alpha^{241\times88\times(254-120)}, \alpha^{241\times88\times(253-120)},$$
$$\ldots \alpha^{241\times88\times(249-120)}, \alpha^{241\times88\times(248-120)}\}$$

The values of the numerator of said Equation (96) are found successively.

As explained above, RS encoding/decoding device 101 can be used to perform RS encoding/decoding on a single Galois field by performing element transformation of the Galois field. As a result, it is possible to reduce the number of multipliers and the number of inverse element arithmetic circuits. Consequently, it is possible to reduce the scale of the device and decrease the manufacturing cost.

That is, with respect to input-side transformation circuit 116 and output-side transformation circuit 119, it is possible to realize any 8×8 matrix arithmetic operation corresponding to the parameter from parameter setting unit 120. Consequently, it is possible to make use of a common hardware for performing multiple types of RS encoding and RS decoding. As a result, compared with the case when multiple types of hardware are used corresponding to different types of RS encoding and RS decoding, the scale and cost are reduced. Also, design flexibility is possible, even when the matrix operation equation is changed. Moreover, because the arithmetic operations are realized in hardware, it is possible to perform the arithmetic operations at high speed.

Also, with respect to surplus arithmetic circuit 102 shown in FIG. 5, syndrome arithmetic circuit 109 shown in FIG. 6, error location detecting circuit 151 shown in FIG. 9, and evaluation value detecting circuit 161 shown in FIG. 10, by reading the multiplication coefficients determined on the basis of control from parameter setting unit 120 from multiplication coefficient memory unit 111 and outputting them to multipliers, there is no need to set a switching circuit, etc. for switching the multiplication coefficients for each circuit. As a result, the overall constitution of the RS encoding/decoding device 101 becomes simpler and smaller in scale.

The present invention is not limited to the aforementioned embodiments.

For example, in the aforementioned embodiments, the correction power of $RS_a$ code is assumed to be identical to that of $RS_b$ code. However, it is clear that one may also adopt a constitution in which one code has a higher correction power in the circuit together with the other code. Also, $RS_a$ code may be Goppa code. That is, in the present invention, the condition for deriving the $RS_a$ code and the $RS_b$ code is that their field formation polynomials should be of the same order.

Also, in the aforementioned embodiments, the Euclidean decoding method is adopted. However, the present invention is not limited to this method. At this point, it can be proved that the series after Galois field transformation is equivalent to the RS code (Goppa code) corresponding to the code forming polynomial of said Equation (27) in a general sense. Consequently, it is possible to make use of the well known RS decoding method (Goppa decoding method or BCH decoding method, a method of an even higher class).

Also, one can further reduce the scale of circuit by selecting a field formation polynomial with the smallest multiplication amount as the field formation polynomial of a prescribed $RS_a$ code.

As explained above, for the Reed-Solomon encoding device and method of the present invention, it is possible to perform RS encoding on a single Galois field by means of element transformation of the Galois field. As a result, it is possible to reduce the number of multipliers and inverse element arithmetic circuits. Consequently, it is possible to reduce the scale of the device, and to decrease the manufacturing cost of the device.

Also, with respect to the Reed-Solomon encoding device and method of the present invention, design flexibility is possible in response to changes in the Galois field of the encoding target data.

Also, for the Reed-Solomon decoding device and method of the present invention, it is possible to perform RS decoding on a single Galois field by means of element transformation of Galois field. As a result, it is possible to reduce the number of multipliers and inverse element arithmetic circuits. Consequently, it is possible to reduce the scale of the device and to decrease the manufacturing cost of the device.

Also, with respect to the Reed-Solomon decoding device and method of the present invention, design flexibility is possible in response to changes in the Galois field of the decoding target data.

What is claimed is:

1. A Reed-Solomon encoding device that can handle multiple RS (Reed-Solomon) codes by means of different field generation polynomials, comprising:

a first Galois field transformation means that transforms source data into a specified Galois field on the basis of a first Galois field transformation parameter;

an encoding means that performs encoding processing using a selected multiplication coefficient set for the aforementioned transformed source data by means of the aforementioned Galois field after transformation;

a second Galois field transformation means that performs an inverse transform of the encoded data on the basis of a second Galois field transformation parameter; and a parameter output means that outputs the first Galois field transformation parameter, the second Galois field transformation parameter, and the selected multiplication coefficient set, wherein the parameter output means is operable to be loaded with transformation parameters and multiplication coefficients selected from a plurality of transformation parameters and multiplication coefficients.

2. The Reed-Solomon encoding device described in claim 1 wherein the encoding means includes a multiplier corresponding to the transformed Galois field.

3. The Reed-Solomon encoding device described in claim 2, further comprising a multiplication coefficient memory means, wherein the parameter output means sends the multiplication coefficients stored in the multiplication coefficient memory means to the multiplier.

4. The Reed-Solomon encoding device described in claim 1 wherein the multiple RS codes are $RS_a$ codes and $RS_b$ codes using different field generation polynomials;

the encoding symbols are Galois fields $GF_a(2^m)$ and $GF_b(2^m)$ extended on the basis of the different m-th order field generation polynomials $Gp_a(x)$ and $Gp_b(x)$ on Galois field GF(2), respectively;

with respect to $\alpha$, which is a root of the $Gp_a(x)$ and a primitive element of the $GF_a(2^m)$, and $\beta$, which is a root of the $Gp_b(x)$ and a primitive element of the $GF_b(2^m)$, the following Equation (1) is established;

the $RS_b$ code is a power of t-symbol correction code, and its code forming polynomial $Gc_b(x)$ is represented by following Equation (2);

when the source data is encoded by means of the $RS_b$ code, then:

the first Galois field transformation means transforms the source data from the Galois field $GF_b(2^m)$ into data of the Galois field $GF_a(2^m)$;

the encoding means performs encoding corresponding to the following Equation (3), which is the polynomial transforming the code forming polynomial $Gc_b(x)$ into the Galois field $GF_a(2^m)$; and the second Galois field transformation means performs the inverse-transform of the encoded data of the Galois field $GF_a(2^m)$ into data of the Galois field $GF_b(2^m)$;

$$Gp_b(\alpha^p) = 0 \qquad \text{Equation 1}$$

$$Gc_b(x) = \prod_{j=0}^{L}(x+\beta^{q(b+j)}), L = 2t-1, \text{ or } 2t \qquad \text{Equation 2}$$

$$Gc_{ba}(x) = \prod_{j=0}^{L}(x+\alpha^{pq(b+j)}), L = 2t-1, \text{ or } 2t. \qquad \text{Equation 3}$$

5. The Reed-Solomon encoding device described in claim 1, wherein for the first Galois field transformation means, when m of the $2^m$ input/output relationships are represented by a transposed matrix $(\ldots)^T$:

with respect to m-bit input $(00\ldots0001)^T$, m-bit output $A_1=(00\ldots1)^T$ is performed;

with respect to m-bit input $(00\ldots0010)^T$, m-bit output $A_1=(A_{1,m-1}, A_{1,m-2}, \ldots A_{1,0})^T$ is performed;

with respect to m-bit input $(00\ldots0100)^T$, m-bit output $A_2=(A_{2,m-1}, A_{2,m-2}, \ldots A_{2,0})^T$ is performed;

with respect to m-bit input $(01\ldots0000)^T$, m-bit output $A_{m-2}=(A_{m-2,m-1}, A_{m-2,m-2}, \ldots A_{m-2,0})^T$ is performed;

with respect to m-bit input $(10\ldots0000)^T$, m-bit output $A_{m-1}=(A_{m-1,m-1}, A_{m-1,m-2}, \ldots A_{m-1,0})^T$ is performed; and when m×m matrix $[H_{ba}]$ is defined by following Equation (4), the m-bit input data $D_{b-in}$, arithmetic operation is performed according to following Equation (5) to form m-bit output data $D_{a-out}$;

$$[H_{ba}] = (A_{m-1}A_{m-2}\cdots A_2A_1A_0) \qquad \text{Equation 4}$$

$$D_{a-out} = [H_{ba}] \times D_{b-in}. \qquad \text{Equation 5}$$

6. The Reed-Solomon encoding device described in claim 5, wherein the parameter output means outputs the matrix $[H_{ba}]$ as the first Galois field transformation parameter to the first Galois field transformation means.

7. The Reed-Solomon encoding device described in claim 6, wherein the parameter output means outputs the rows of the matrix $[H_{ba}]$ as the first Galois field transformation parameter to the first Galois field transformation means in row order; and wherein the first Galois field transformation means comprises:

multiple AND operation means corresponding in number to the bit data and performing the following operation: input from a first inputting terminal the bit data corresponding to the rows of the matrix $[H_{ba}]$ input as the first Galois field transformation parameter, inputting from a second input terminal the corresponding bit data of the source data, and performing a logical AND operation on the bit data input from the first input terminal and the bit data input from the second input terminal; and an exclusive-OR operation means that performs an exclusive-OR operation on the results of the multiple AND operations.

8. The Reed-Solomon encoding device described in claim 5, wherein when the inverse matrix of the matrix $[H_{ba}]$ is set as $[H_{ab}]$, the second Galois field transformation means performs an arithmetic operation according to following Equation (6) to form m-bit output data $D_{b\text{-}out}$;

$$D_{b\text{-}out} = [H_{ab}] \times D_{a\text{-}in}. \qquad \text{Equation 6}$$

9. The Reed-Solomon encoding device described in claim 8, wherein the parameter output means outputs the matrix $[H_{ab}]$ as the second Galois field transformation parameter to the second Galois field transformation means.

10. The Reed-Solomon encoding device described in claim 9, wherein the parameter output means outputs rows of the matrix $[H_{ab}]$ as the second Galois field transformation parameter to the second Galois field transformation means in row order; and wherein the second Galois field transformation means comprises:

multiple AND operation means corresponding in number to the bit data and performing the following operation: input from a first inputting terminal the bit data corresponding to the rows of the matrix $[H_{ab}]$ input as the second Galois field transformation parameter, inputting from a second input terminal the corresponding bit data of the encoded data, and performing a logical AND operation on the bit data input from the first input terminal and the bit data input from the second input terminal; and an exclusive-OR operation means that performs an exclusive-OR operation on the results of the multiple AND operations.

11. A Reed-Solomon decoding device that can handle multiple RS (Reed-Solomon) codes by means of different field generation polynomials, comprising:

a first Galois field transformation means that transforms source data into a specified Galois field on the basis of a first Galois field transformation parameter;

a decoding means that performs decoding processing using a selected multiplication coefficient set for the aforementioned transformed source data by means of the aforementioned Galois field after transformation;

a second Galois field transformation means that performs an inverse transform of the decoded data on the basis of a second Galois field transformation parameter; and a parameter output means that outputs the first Galois field transformation parameter, the second Galois field transformation parameter, and the selected multiplication coefficient set, wherein the parameter output means is operable to be loaded with transformation parameters and multiplication coefficients selected from a plurality of transformation parameters and multiplication coefficients.

12. The Reed-Solomon decoding device described in claim 11, wherein the decoding means has a multiplier corresponding to the transformed Galois field.

13. The Reed-Solomon decoding device described in claim 12, further comprising a multiplication coefficient memory means, wherein the parameter output means sends the multiplication coefficient stored in the multiplication coefficient memory means to the multiplier.

14. The Reed-Solomon decoding device described in claim 11, wherein the multiple RS codes are $RS_a$ codes and $RS_b$ codes using different field generation polynomials;

the encoding symbols are Galois fields $GF_a(2^m)$ and $GF_b(2^m)$ extended on the basis of the different m-th field generation polynomials $Gp_a(x)$ and $Gp_b(x)$ on Galois field GF(2), respectively;

with respect to $\alpha$, which is a root of the $Gp_a(x)$ and a primitive element of the $GF_a(2^m)$, and $\beta$, which is a root of the $Gp_b(x)$ and a primitive element of the $GF_b(2^m)$, the following Equation (7) is established;

the $RS_b$ code is a power of t-symbol correction code, and its code forming polynomial $Gc_b(x)$ is represented by following Equation (8);

when the source data is decoded, then:

the first Galois field transformation means transforms the decoding target data from the Galois field $GF_b(2^m)$ into data of the Galois field $GF_a(2^m)$;

the decoding means performs decoding corresponding to the following Equation (9) that is the polynomial transforming the code forming polynomial $Gc_b(x)$ into the Galois field $GF_a(2^m)$; and the second Galois field transformation means transforms the decoded data from the Galois field $GF_a(2^m)$ into data of the Galois field $GF_b(2^m)$;

$$Gp_b(\alpha^p) = 0 \qquad \text{Equation 7}$$

$$Gc_b(x) = \prod_{j=0}^{L} (x + \beta^{q(b+j)}), L = 2t - 1, \text{ or } 2t \qquad \text{Equation 8}$$

$$Gc_{ba}(x) = \prod_{j=0}^{L} (x + \alpha^{pq(b+j)}), L = 2t - 1, \text{ or } 2t. \qquad \text{Equation 9}$$

15. The Reed-Solomon decoding device described in claim 11, wherein for the first Galois field transformation means, when m of the $2^m$ input/output relationships are represented by a transposed matrix $(\ldots)^T$;

with respect to m-bit input $(00 \ldots 0001)^T$, m-bit output $A_1 = (00 \ldots 001)^T$ is performed;

with respect to m-bit input $(00 \ldots 0010)^T$, m-bit output $A_1 = (A_{1,m-1}, A_{1,m-2}, \ldots A_{1,0})^T$ is performed;

with respect to m-bit input $(00 \ldots 0100)^T$, m-bit output $A_2 = (A_{2,m-1}, A_{2,m=2}, \ldots A_{2,0})^T$ is performed;

with respect to m-bit input $(01 \ldots 0000)^T$, m-bit output $A_{m-2} = (A_{m-2,m-1}, A_{m-2,m-2}, \ldots A_{m-2,0})^T$ is performed;

with respect to m-bit input $(10 \ldots 0000)^T$, m-bit output $A_{m-1} = (A_{m-1,m-1}, A_{m-1,m-2}, \ldots A_{m-1,0})^T$ is performed; and when m×m matrix $[H_{ba}]$ is defined by following Equation (10), the m-bit input data $D_{b\text{-}in}$, arithmetic operation is performed according to following Equation (11) to form m-bit output data $D_{a\text{-}out}$;

$$[H_{ba}] = (A_{m-1} \; A_{m-2} \; \ldots \; A_2 \; A_1 \; A_0) \qquad \text{Equation 10}$$

$$D_{a\text{-}out} = [H_{ba}] \times D_{b\text{-}in}. \qquad \text{Equation 11}$$

16. The Reed-Solomon decoding device described in claim 15, wherein the parameter output means outputs the matrix $[H_{ba}]$ as the first Galois field transformation parameter to the first Galois field transformation means.

17. The Reed-Solomon decoding device described in claim 16, wherein the parameter output means outputs rows of the matrix $[H_{ba}]$ as the first Galois field transformation parameter to the first Galois field transformation means in row order; and wherein the first Galois field transformation means comprises:

multiple AND operation means corresponding in number to the bit data and performing the following operation: input from a first inputting terminal the bit data corresponding to the rows of the matrix $[H_{ba}]$ input as the first Galois field transformation parameter, inputting from a second input terminal the corresponding bit data of the source data, and performing a logical AND operation on the bit data input from the first input terminal and the bit data input from the second input terminal; and an Exclusive-OR operation means that performs an exclusive-OR operation on the results of the multiple AND operations.

18. The Reed-Solomon decoding device described in claim 15, wherein when the inverse matrix of the matrix $[H_{ba}]$ is taken as $[H_{ab}]$, the second Galois field transformation means performs an arithmetic operation according to the following Equation (12) to form m-bit output data $D_{b\text{-}out}$;

$$D_{b\text{-}out} = [H_{ab}] \times D_{a\text{-}in}. \qquad \text{Equation 12}$$

19. The Reed-Solomon decoding device described in claim 18, wherein the parameter output means outputs the matrix $[H_{ab}]$ as the second Galois field transformation parameter to the second Galois field transformation means.

20. The Reed-Solomon decoding device described in claim 19, wherein the parameter output means outputs rows of the matrix $[H_{ab}]$ as the second Galois field transformation parameter to the second Galois field transformation means in row order; and wherein the second Galois field transformation means comprises:

multiple AND operation means corresponding in number to the bit data and performing the following operation: input from a first inputting terminal the bit data corresponding to the rows of the matrix $[H_{ab}]$ input as the second Galois field transformation parameter, inputting from a second input terminal the corresponding bit data of the encoded data, and performing a logical AND operation on the bit data input from the first input terminal and the bit data input from the second input terminal; and an exclusive-OR operation means that performs an exclusive-OR operation on the results of the multiple AND operations.

21. A Reed-Solomon encoding/decoding device that can handle multiple RS (Reed-Solomon) codes by means of different field generation polynomials, comprising:

a first Galois field transformation circuit operable to transform source data into a specified Galois field on the basis of a first Galois field transformation parameter;

an encoding/decoding circuit connected to receive the transformed source data, operable to perform encoding or decoding processing using a selected multiplication coefficient set for the aforementioned transformed source data by means of the aforementioned Galois field after transformation;

second Galois field transformation circuit connected to receive the encoded or decoded data from the encoding/decoding circuit, operable to perform an inverse transform of the encoded or decoded data on the basis of a second Galois field transformation parameter; and a parameter output circuit operable to be loaded with the first Galois field transformation parameter, the second Galois field transformation parameter, and the selected multiplication coefficients selected from a plurality of transformation parameters and multiplication coefficients, wherein the parameter circuit is connected to provide the first Galois field transformation parameter to the first Galois transformation circuit, the second Galois field transformation parameter to the second Galois transformation circuit, and the selected multiplication coefficients to the encoding/decoding circuit.

* * * * *